(12) United States Patent
Lee et al.

(10) Patent No.: US 9,053,963 B2
(45) Date of Patent: Jun. 9, 2015

(54) MULTIPLE WELL BIAS MEMORY

(71) Applicant: Samsung Electronics Co., Ltd., Suwon-Si, Gyeonggi-Do (KR)

(72) Inventors: Chung-ki Lee, Seoul (KR); Hong-sun Hwang, Suwon-si (KR); Hyung-shin Kwon, Seongnam-si (KR); Jong-hyoung Lim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/938,314

(22) Filed: Jul. 10, 2013

(65) Prior Publication Data

US 2014/0092680 A1    Apr. 3, 2014

(30) Foreign Application Priority Data

Sep. 28, 2012  (KR) .................. 10-2012-0109255

(51) Int. Cl.
| | |
|---|---|
| G11C 7/00 | (2006.01) |
| H01L 27/088 | (2006.01) |
| G11C 11/40 | (2006.01) |
| G11C 11/404 | (2006.01) |
| G11C 11/408 | (2006.01) |
| H01L 27/108 | (2006.01) |
| G11C 11/4094 | (2006.01) |

(52) U.S. Cl.
CPC ............... *H01L 27/088* (2013.01); *G11C 11/40* (2013.01); *G11C 11/404* (2013.01); *G11C 11/4085* (2013.01); *G11C 11/4094* (2013.01); *G11C 2207/005* (2013.01); *H01L 27/10897* (2013.01)

(58) Field of Classification Search
CPC .................................................. G11C 11/4091

USPC ..................................... 365/203, 205, 230.06
See application file for complete search history.

(56) References Cited

U.S. PATENT DOCUMENTS

| | | | |
|---|---|---|---|
| 5,281,842 A | 1/1994 | Yasuda et al. | |
| 5,293,055 A | 3/1994 | Hara et al. | |
| 5,373,476 A | 12/1994 | Jeon | |
| 5,595,925 A | 1/1997 | Chen et al. | |
| 5,726,475 A * | 3/1998 | Sawada et al. | 257/369 |
| 5,984,145 A | 11/1999 | McAllister | |
| 6,002,162 A | 12/1999 | Takahashi et al. | |
| 6,228,704 B1 | 5/2001 | Uchida | |
| 6,472,716 B2 | 10/2002 | Igaue et al. | |
| 6,531,363 B2 | 3/2003 | Uchida | |
| 7,342,291 B2 | 3/2008 | Vogelsang | |
| 2001/0015930 A1* | 8/2001 | Ooishi | 365/205 |
| 2004/0262706 A1* | 12/2004 | Park et al. | 257/452 |

FOREIGN PATENT DOCUMENTS

| | | |
|---|---|---|
| KR | 1024148 | 7/2003 |
| KR | 20050102725 A | 10/2005 |
| KR | 0801831 | 4/2006 |

* cited by examiner

*Primary Examiner* — Hoai V Ho
(74) *Attorney, Agent, or Firm* — Harness, Dickey & Pierce, P.L.C.

(57) ABSTRACT

A multiple well bias memory device that includes a semiconductor substrate; a first well of a first conductivity type formed in the semiconductor substrate and having a memory cell formed therein; and a second well of the first conductivity type formed in the semiconductor substrate and having formed therein a sense amplifier configured to sense and amplify data from the memory cell. The first and second wells have different doping concentrations and are biased to first and second voltages, respectively. The first voltage being lower than the second voltage.

20 Claims, 18 Drawing Sheets

MULTIPLE WELL BIAS MEMORY

CROSS-REFERENCE TO RELATED APPLICATIONS

This application claims the benefit of Korean Patent Application No. 10-2012-0109255, filed on Sep. 28, 2012, in the Korean Intellectual Property Office, the disclosure of which is incorporated herein in its entirety by reference.

BACKGROUND

Example embodiments of the inventive concepts relate to a semiconductor memory device.

Semiconductor memory devices such as dynamic random access memories (DRAMs) have traditionally exploited a body bias voltage applied to a substrate and/or a well to achieve latch-up prevention, cell isolation, and improved circuit speed. However, in sub-micron devices, the body bias voltage may enhance an undesirable short channel effect. This short channel effect causes a threshold voltage difference between transistors of different sizes upon application of a body bias voltage. This threshold voltage difference may degrade the performance of a sense amplifier within a DRAM. Thus, there is a need for a technique to prevent degradation in the performance of a sense amplifier.

SUMMARY

Some example embodiments provide a semiconductor memory device employing well bias separation to improve the sensing efficiency of a sense amplifier, and a memory module or a memory system equipped with the semiconductor memory device.

According to an example embodiment, there is provided a semiconductor memory device including: a semiconductor substrate; a first well of a first conductivity type formed in the semiconductor substrate and having a memory cell formed therein; and a second well of the first conductivity type formed in the semiconductor substrate and having formed therein a sense amplifier for sensing and amplifying data in the memory cell. The first well is biased to a first voltage, and the second well is biased to a second voltage other than the first voltage.

The first voltage may be lower than the second voltage.

The first and second wells may have different doping concentrations.

The semiconductor memory device may further include a third well of a second conductivity type, which is formed in the semiconductor substrate and has the sense amplifier formed therein. The third well is biased to a third voltage different from the first and second voltages.

The first conductivity type may be a P-type, and the second conductivity type may be an N-type.

The semiconductor memory device may further include a third well of a second conductivity type formed between the first and second wells in the semiconductor substrate for isolation.

The semiconductor memory device may further include a fourth well of the first conductivity type, which is formed between the second and third wells in the semiconductor substrate and has a circuit that is connected to the sense amplifier therein. The fourth well may be biased to the second voltage. The second and fourth wells may have the same doping concentration.

The semiconductor memory device may further include a fourth well of the first conductivity type, which is formed between the first and third wells in the semiconductor substrate and has a circuit that is connected to the sense amplifier therein. The fourth well may be biased to the first voltage. The second and fourth wells may have the same doping concentration. The circuit may be a precharge circuit for precharging a bit line and a complementary bit line of the memory cell, or a column select circuit for connecting the bit line and the complementary bit line to an input/output (I/O) line and a complementary I/O line, respectively.

According to another example embodiment, there is provided a semiconductor memory device including: a semiconductor substrate; a first well of a first conductivity type formed in the semiconductor substrate and having a memory cell formed therein; and a second well of the first conductivity type formed in the semiconductor substrate and having formed therein a sub-word line driver for driving a word line of the memory cell. The first well is biased to a first voltage, and the second well is biased to a second voltage other than the first voltage.

At least one example embodiment relates to a semiconductor memory device.

In one embodiment, the semiconductor memory device includes a memory cell formed in a first p-type well of a substrate, the memory cell having a first n-type metal oxide semiconductor (NMOS) transistor, the first NMOS transistor configured to receive a first back bias voltage to adjust a threshold voltage of the first NMOS transistor; and at least one of a line driver and a sense amplifier formed in second p-type wells of the substrate, the line driver and the sense amplifier each including a second NMOS transistor, the line driver configured to drive a word line of the memory cell to output data and the sense amplifier configured to sense and amplify the data output from the memory cell, the second NMOS transistor configured to receive a second back bias voltage to adjust the threshold voltage of the second NMOS transistor, the second back bias voltage being a different voltage from the first back bias voltage.

In one embodiment, the threshold voltage of the first NMOS transistor and the second NMOS transistor decrease by different amounts, if the first back bias voltage and the second back bias voltage are respectively applied thereto.

In one embodiment, the semiconductor memory device may include guard rings formed in n-type wells between the memory cell and the at least one of the line driver and the sense amplifier, the guard rings configured to isolate the memory cell from the at least one of the line driver and the sense amplifier.

In one embodiment, the semiconductor memory device may include a precharge circuit formed in a third p-type well on a first side of the sense amplifier, the precharge circuit configured to precharge bit lines of the memory cell; and a column select circuit formed in a fourth p-type well on a second side of the sense amplifier, the column select circuit configured to connect the bit lines to input/output (I/O) lines. The precharge circuit and the column select circuit each include a third NMOS transistor configured to receive the second back bias voltage to adjust the threshold voltage of the third NMOS transistor.

In one embodiment, the first back bias voltage is less than the second back bias voltage.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Example embodiments will now be described more fully hereinafter with reference to the accompanying drawings, in which specific example embodiments are shown. These example embodiments are provided so that this disclosure will be thorough and complete, and will fully convey the scope of the invention to those skilled in the art. The embodiments may, however, be embodied in many different forms and should not be construed as limited to the example embodiments set forth herein. The example embodiments should be construed as including all of the changes, equivalents, and substitutions included in the spirit and scope of those example embodiments presented. Like numbers refer to like elements throughout. Sizes of structures may be exaggerated or reduced for clarity.

The terminology used herein is for the purpose of describing particular exemplary embodiments only and is not intended to limit the invention. As used herein, the singular forms "a", "an", and "the" are intended to include the plural forms as well, unless the context clearly indicates otherwise. It will be further understood that the terms "comprises" and/or "comprising," or "includes" and/or "including" when used in this specification, specify the presence of stated features, integers, steps, operations, elements, components and/or groups thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A semiconductor memory device such as a dynamic random access memory (DRAM) is mainly divided into a cell area, a core area, and a peripheral circuit area. The cell area has a plurality of memory cells arranged in rows and columns. The core area includes word line drivers and sense amplifiers. The peripheral circuit area includes circuits for performing data input/output (I/O) to/from the memory cells.

Figure 1:
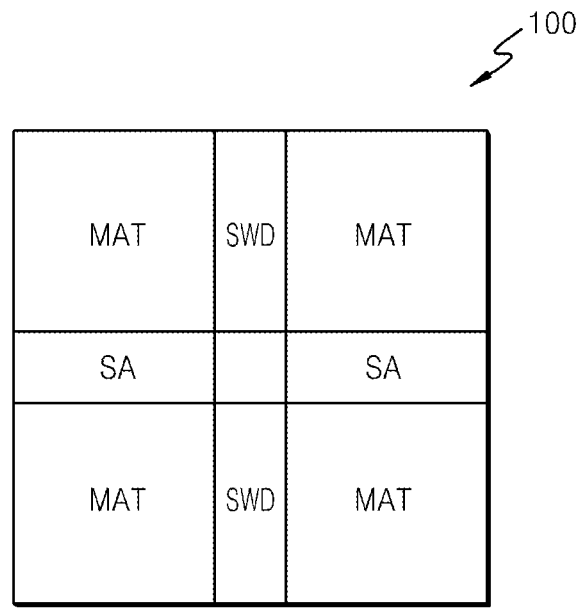
FIG. 1 illustrates an arrangement structure of a semiconductor memory device according to an example embodiment.

FIG. 1 illustrates an arrangement structure of a semiconductor memory device 100 according to an example embodiment.

Referring to FIG. 1, the semiconductor memory device 100 includes a cell area and a core area. The cell area has a plurality of memory cell array (MAT) regions, and the core area includes sub-word line driver (SWD) regions and sense amplifier SA regions, respectively located between adjacent MAT regions.

Figure 2:
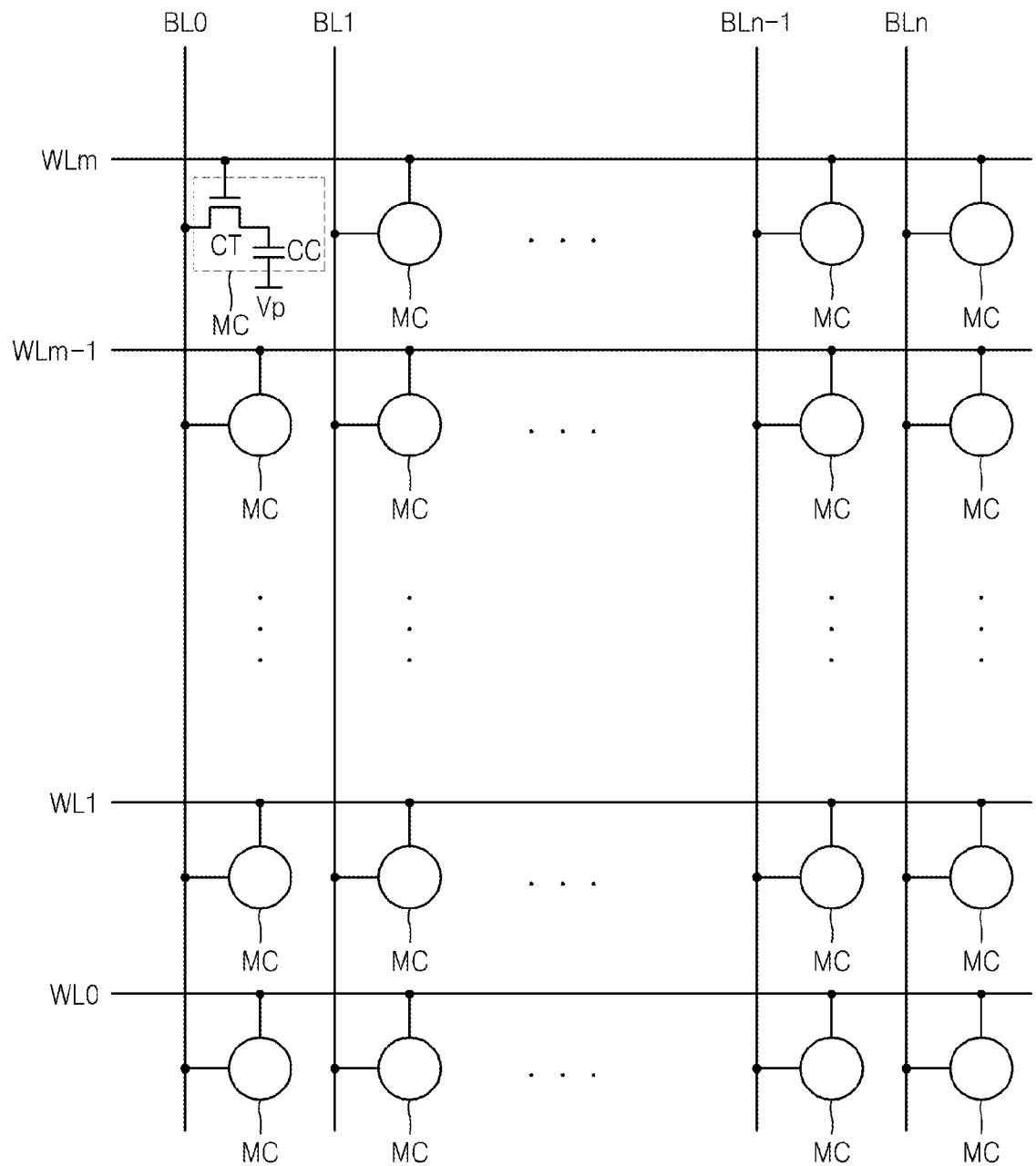
FIG. 2 is a circuit diagram of the memory cell array region shown in FIG. 1.

Referring to FIG. 2, a MAT region includes memory cells (MC) arranged at intersections between word lines WL0 through WLm and bit lines BL0 through BLn. Each memory cell (MC) includes a cell transistor CT and a cell capacitor CC. The cell transistor CT may be realized as an N-type Metal-Oxide-Semiconductor (NMOS) transistor.

Each of the word lines WL0 through WLm is connected to a gate terminal of a corresponding cell transistor CT, and the gate terminal is typically made of polysilicon with high sheet resistance. Each of the word lines WL0 through WLm is also formed over a gate insulating layer of a cell transistor CT to have a large capacitance. Increased resistance of the word lines WL0 through WLm may result in an increase in an RC delay and a strength of a driver for driving the word lines WL0 through WLm. This causes the word lines WL0 through WLm to be driven at a high voltage, thereby increasing power consumption. For low power consumption, it is necessary to optimize the lengths of the word lines WL0 and reduce their resistances.

One approach to reducing power consumption is to use a hierarchical word line structure in which a word line is divided into a plurality of sub-word lines with optimum lengths. In this structure, a combination of main word lines coupled to a row decoder and sub-word lines coupled to sub-word line drivers SWDs is used to drive the sub-word lines. The row decoder includes a main word line driver and a sub-word line control signal generator. The main word line driver produces a main word line enable signal, and the sub-word line control signal generator generates a plurality of sub-word line control signals PXiD, PXiDG, and PXiB.

Figure 3:
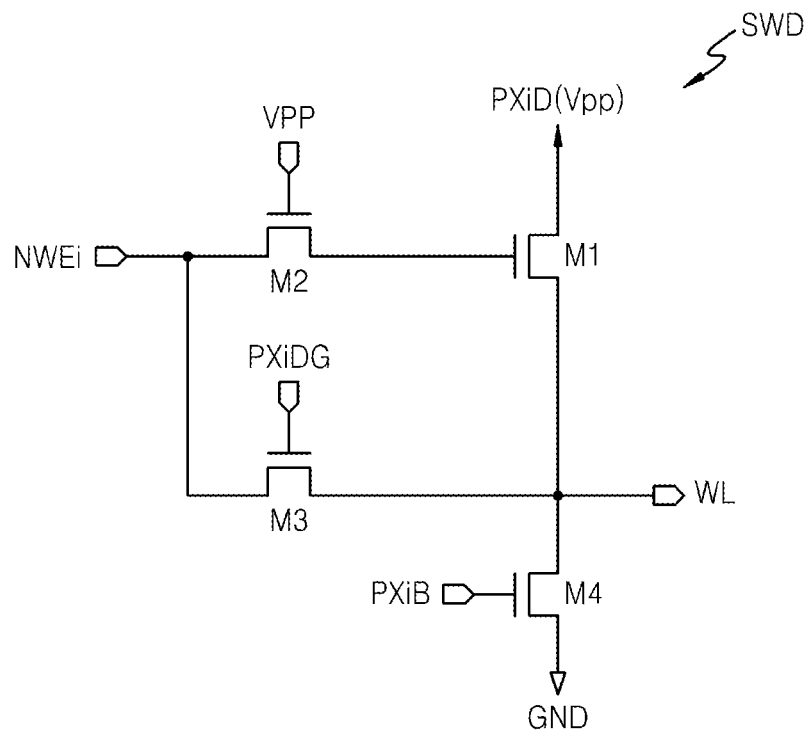
FIG. 3 is a circuit diagram of the word line driver shown in FIG. 1.

FIG. 3 illustrates a circuit diagram of the word line driver shown in FIG. 1.

As illustrated in FIG. 3, the SWD may include four transistors M1 through M4. The SWD drives a corresponding word line WL in response to the main word line enable signal NWEi, the plurality of sub-word line control signals PXiD, PXiDG, and PXiB and a Peak-to-Peak voltage VPP.

Figure 4:
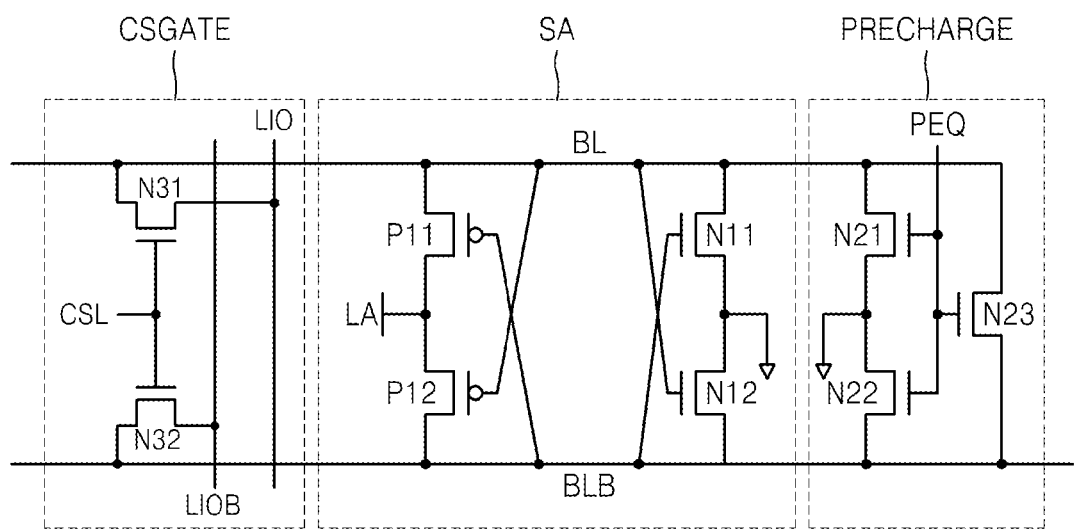
FIG. 4 is a circuit diagram of the sense amplifier shown in FIG. 1.

FIG. 4 illustrates a circuit diagram of the sense amplifier shown in FIG. 1.

Referring to FIG. 4, a sense amplifier SA includes a pair of first and second P-type MOS (PMOS) transistors P11 and P12 and a pair of first and second NMOS transistors N11 and N12, each pair being cross-coupled between a bit line BL and a complementary bit line BLB. The first and second PMOS transistors P11 and P12 receive a sensing voltage through a sensing enable signal input terminal LA and sense and amplify a voltage difference between the bit line BL and the complementary bit line BLB. Although the first and second PMOS transistors P11 and P12 may have different sizes, it is desirable that they have the same size.

The first and second NMOS transistors N11 and N12 receive a precharge voltage via a precharge voltage terminal VPRE and sense and amplify a voltage difference between the bit line BL and the complementary bit line BLB. Although the first and second NMOS transistors N11 and N12 may have different sizes, it is desirable that they have the same size. The sensing voltage may be a power supply voltage of a semiconductor memory device or an internal voltage which may be generated within the semiconductor memory device by using the power supply voltage. The precharge voltage may be a ground voltage.

Referring to FIG. 4, the sense amplifier SA is coupled to a bit line precharge circuit PRECHARGE and a column select circuit CSGATE. The bit line precharge circuit PRECHARGE equalizes the bit line BL and the complementary bit line BLB to a ground voltage (VSS) level in response to an equalizing signal PEQ. The bit line precharge circuit PRECHARGE includes first through third NMOS transistors N21 through N23 having gates connected to the equalizing signal PEQ.

The equalizing signal PEQ is applied at a logic high level during a precharge operation of the semiconductor memory device 100 to turn on the first through third NMOS transistors N21 through N23 and precharge the bit line BL and the complementary bit line BLB to the VSS level. During an active operation and a sensing operation, the equalizing signal PEQ is applied at a low logic level to turn off the first through third NMOS transistors N21 through N23.

The column select circuit CSGATE connects the bit line BL and the complementary bit line BLB to an input/output (I/O) line LIO and a complementary I/O line LIOB, respectively, in response to a column select signal CSL. The column select circuit CSGATE includes first and second NMOS transistors N31 and N32. The first NMOS transistor N31 transmits a voltage on the complementary bit line BLB and a voltage on the bit line BL, which are sensed and amplified by the sense amplifier SA to the complementary I/O line LIOB and the I/O line LIO, respectively, in response to the column select signal CSL.

Figure 5:
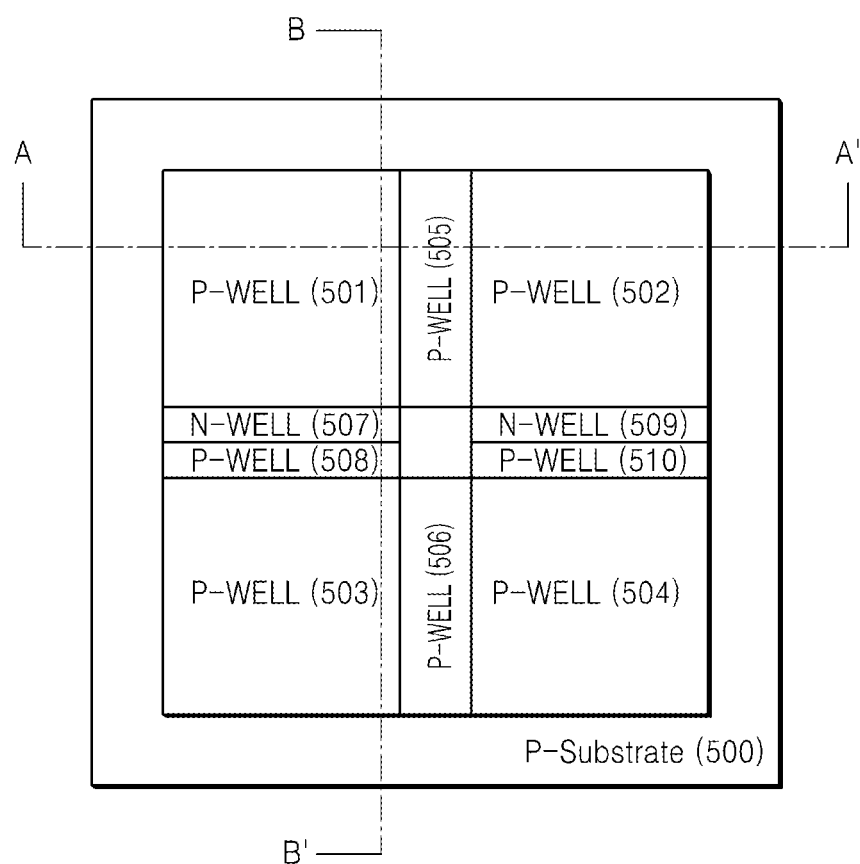
FIG. 5 illustrates an arrangement of wells in the semiconductor memory device of FIG. 1.

FIG. 5 illustrates an arrangement of wells in the semiconductor memory device 100 of FIG. 1.

Referring to FIG. 5, P-wells 501 through 504 for MAT regions are arranged on a P-type semiconductor substrate 500 (hereinafter, P-type substrate is referred to as "P-substrate"). P-wells 505 and 506 for SWD regions are disposed between the P-wells 501 and 502 and between the P-wells 503 and 504, respectively. P-wells 508 and 510 and N-wells 507 and 509 for SA regions are also disposed between the P-wells 501 and 503 and between the P-wells 502 and 504, respectively.

The P-wells 501 through 504 for the MAT regions have cell transistors CT formed therein. The P-wells 508 and 510 respectively have the first and second NMOS transistors N11 and N12 of the sense amplifier SA formed therein, while the N-wells 507 and 509 respectively have the first and second PMOS transistors P11 and P12 of the sense amplifier SA formed therein.

Figure 6A:
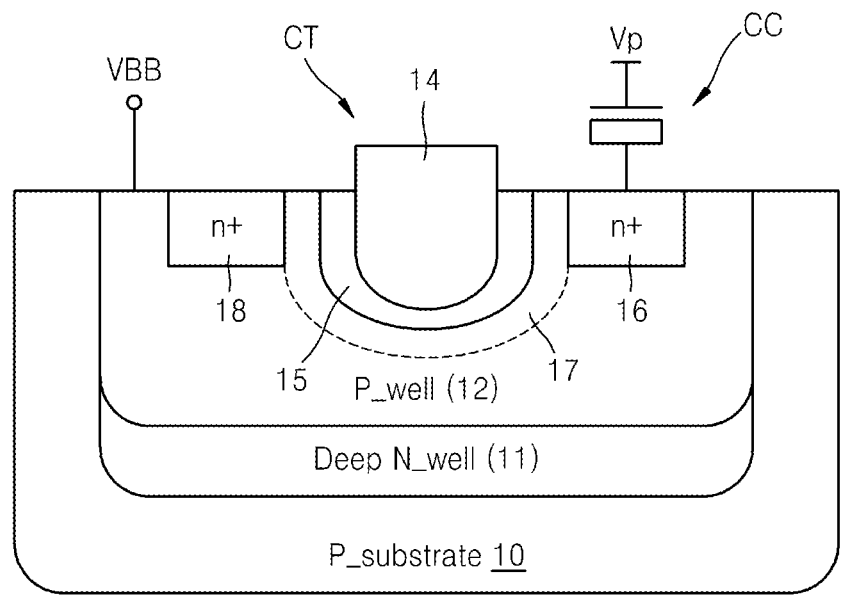
FIGS. 6A and 6B are cross-sectional views of N-type Metal-Oxide-Semiconductor (NMOS) transistors in the memory cell array region and the sense amplifier region shown in FIG. 1.
Figure 6B:
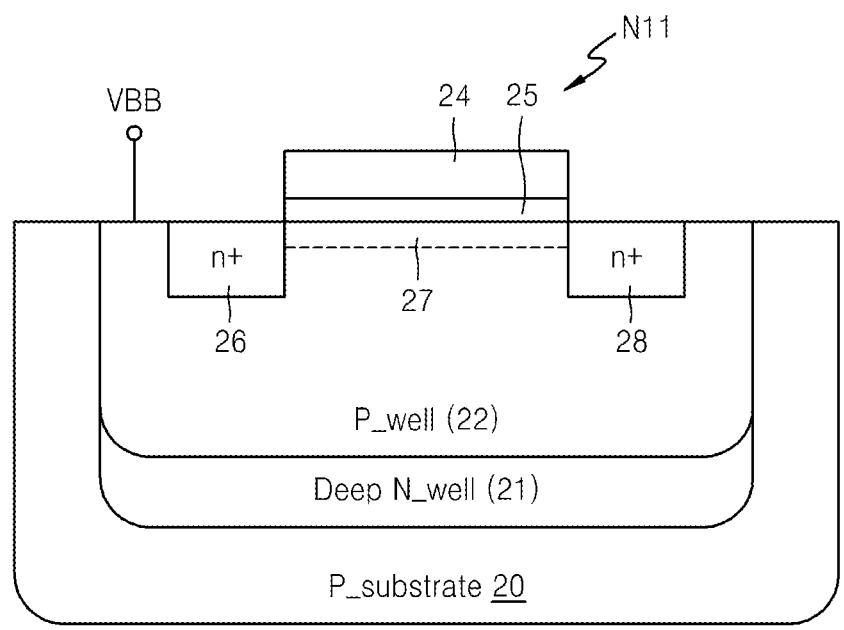

FIGS. 6A and 6B are cross-sectional views of the cell transistor CT, as an NMOS transistor, and the first NMOS transistor N11 in a MAT region and an SA region, respectively.

Referring to FIG. 6A, a cell transistor CT and a cell capacitor CC are disposed on a P-type semiconductor substrate 10. A deep N-well 11 is formed in the P-type semiconductor substrate 10, and a P-well 12 for the cell transistor CT is formed in the deep N-well 11. The cell transistor CT has a source 16 and a drain 18 separately formed in a surface of the P-well 12, and a gate 14 including a gate insulating layer 15 buried in the P-well 12 between the source 16 and the drain 18. The source 16 of the cell transistor CT is coupled to the cell capacitor CC that is connected to a plate voltage Vp. The source 16 and the drain 18 are connected through a channel 17 formed by a voltage that is applied to the gate 14. The P-well 12 uses a negative voltage VBB as a bias voltage. The bias voltage of the P-well 12 is a back bias of the cell transistor CT.

Referring to FIG. 6B, the first NMOS transistor N11 for a sense amplifier is formed on a P-type semiconductor substrate 20. A deep N-well 21 is formed in the P-type semiconductor substrate 20, and a P-well 22 for the first NMOS transistor N11 is formed in the deep N-well 21. The first NMOS transistor N11 has a source 26 and a drain 28 separately formed in a surface of the P-well 22 and a gate 24 including a gate insulating layer 25 buried in the P-well 22 between the source 26 and the drain 28. The source 26 and the drain 28 are connected through a channel 27 formed by a voltage that is applied to the gate 24. The P-well 22 uses a negative voltage VBB as a bias voltage. The bias voltage of the P-well 22 is a back bias of the first NMOS transistor N11.

A threshold voltage Vt of the cell transistor CT and first NMOS transistor N11 respectively shown in FIGS. 6A and 6B are defined by Equation (1):

$$Vt = Vto + \gamma[\sqrt{(2\Phi b + |Vsb|)} - \sqrt{2\Phi b}] \quad (1)$$

where Vto is a threshold voltage when Vsb=0V, and Vsb is a voltage difference between a source of a transistor and a back bias.

A parameter γ is defined by Equation (2):

$$\gamma = \frac{1}{Cox}\sqrt{2q\varepsilon_{si}N_A} \quad (2)$$

$$Cox = \frac{\varepsilon_{ox}}{t_{ox}}$$

where $\varepsilon_{ox}$ and $t_{ox}$ are a dielectric constant and a thickness of a gate insulating layer respectively, and $\varepsilon_{si}$ is a dielectric constant of silicon.

As evident from Equation (1), the threshold voltage Vt is proportional to the voltage difference Vsb and is affected by a negative voltage VBB that is a back bias voltage.

The voltage VBB may affect various AC timing parameters of a DRAM, such as parameters referred as tRCD, tRP, tRDL, and tAA. The tRCD parameter represents a row address-to column address delay time or the number of clock cycles between an active command and a read/write command. The parameter tRP is a row precharge time or the number of clock cycles between a precharge command and an active command. The tRDL and tAA parameters stand for last data in to row precharge and internal read command to first data, respectively.

Figure 7:
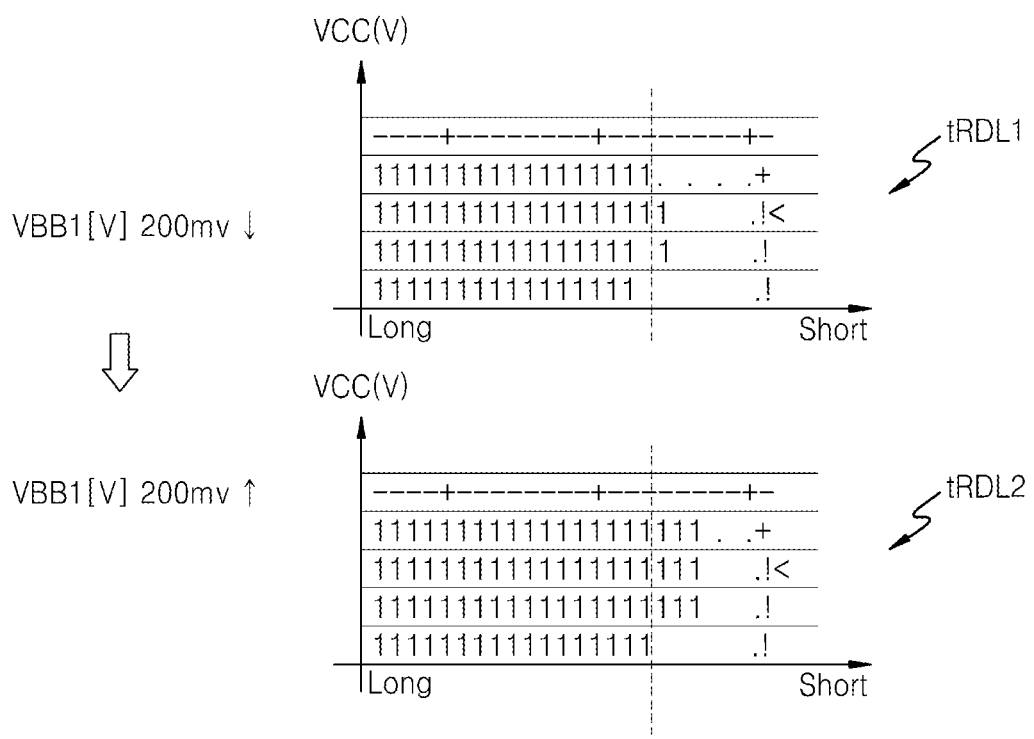
FIG. 7 is a diagram for explaining a tRDL parameter in a dynamic random access memory (DRAM) with respect to a voltage VBB.

FIG. 7 illustrates a distribution of tRDL parameter characteristics of a DRAM.

As illustrated in FIG. 7, the first tRDL characteristics tRDL1 are shown at a back bias voltage that is 200 mV less than the voltage VBB and the second tRDL characteristics tRDL2 are shown at a back bias voltage that is 200 mV greater than the voltage VBB. As can be seen in FIG. 7, a minimum timing for the second tRDL characteristics tRDL2 is improved compared to a minimum timing for the first tRDL characteristics tRDL1. In other words, the DRAM exhibits better tRDL characteristics at a back bias voltage that is 200 mV higher than the voltage VBB. A margin of the tRDL parameter is affected by variations in a level of the voltage VBB.

Figure 8:
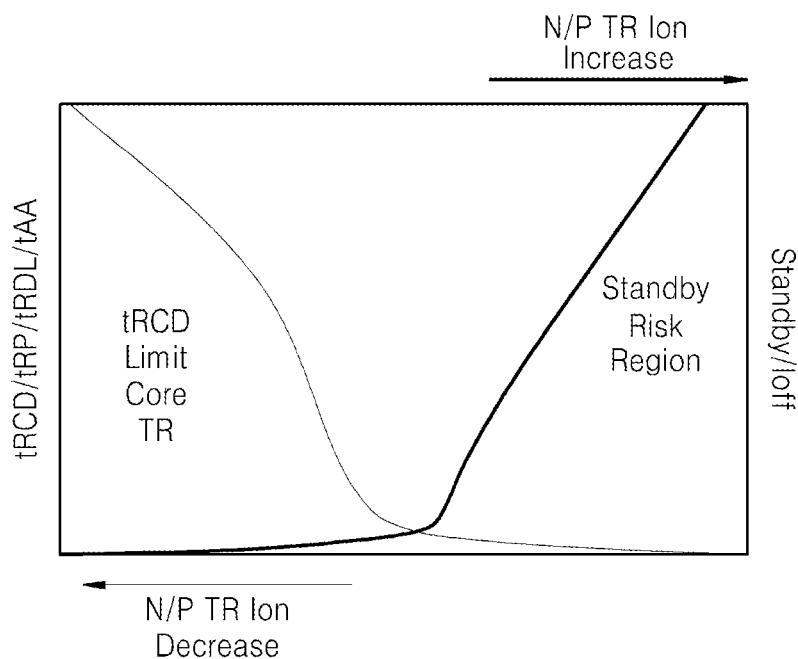
FIG. 8 is a diagram for explaining DRAM parameters with respect to transistor characteristics in a core area.

FIG. 8 is a diagram for explaining DRAM parameters with respect to transistor characteristics in a core area.

Referring to FIG. 8, as on-current Ion flowing through NMOS and PMOS transistors decreases, values of tRCD, tRP, tRDL, tAA timing parameters increase. Thus, limits of the timing parameters may be obtained. As the on-current flowing through NMOS and PMOS transistors increases, leakage current, standby current, or off-current Ioff of the NMOS and PMOS transistors increase. Thus, a region in a DRAM may have poor standby characteristics. Since on-current Ion and off-current Ioff of a transistor is affected by a VBB voltage level, it is necessary to optimize a voltage VBB by considering margins of transistor characteristics in a core area.

Figure 9:
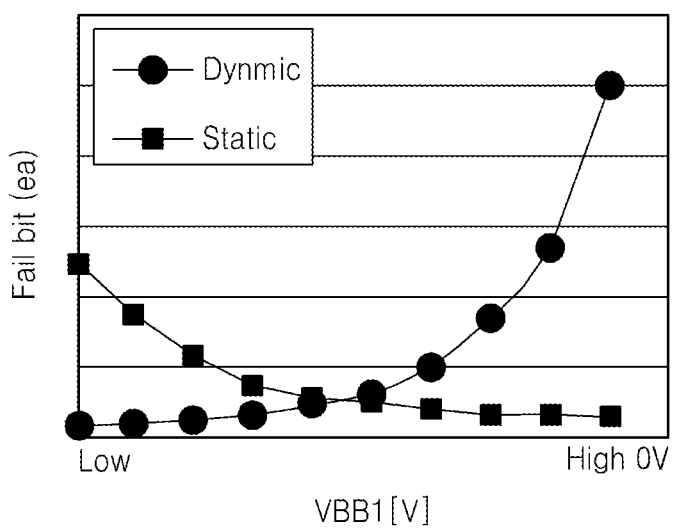
FIG. 9 is a graph illustrating characteristics of a memory cell array region with respect to a VBB voltage level of a cell transistor.

FIG. 9 is a graph illustrating characteristics of a memory cell array region with respect to a VBB voltage level of a cell transistor CT.

Referring to FIG. 9, the number of static fail bits increases at a lower VBB voltage level. A static failure is related to a junction leakage current. Conversely, the number of dynamic fail bits increases at a higher VBB voltage level. A dynamic failure is related to a transistor leakage current. Thus, it is necessary to optimize a VBB voltage of a cell transistor CT by considering trade offs between static and dynamic characteristics of a memory cell array region.

Figure 10:
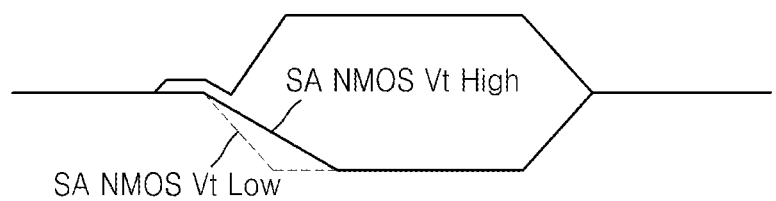
FIG. 10 illustrate sense amplifier characteristics using the voltage VBB in FIGS. 6A and 6B.

FIG. 10 illustrates sense amplifier characteristics using the voltage VBB in FIGS. 6A and 6B.

Referring to FIGS. 6A, 6B and 10, when back bias voltages of a cell transistor CT and a first NMOS transistor N11 are the same as a voltage VBB, as illustrated in FIGS. 6A and 6B, it is difficult to optimize both characteristics of the cell transistor CT and the first NMOS transistor N11. For example, if the VBB voltage of the cell transistor CT is determined to optimize static and dynamic characteristics of the memory cell array region, the threshold voltage Vt of the first NMOS transistor N11 may be increased. As illustrated in FIG. 10, such an increase in the threshold voltage Vt of the first NMOS transistor N11 may retard the pull-down of the sense amplifier SA, thereby increasing the tRCD parameter of the DRAM.

Figure 11A:
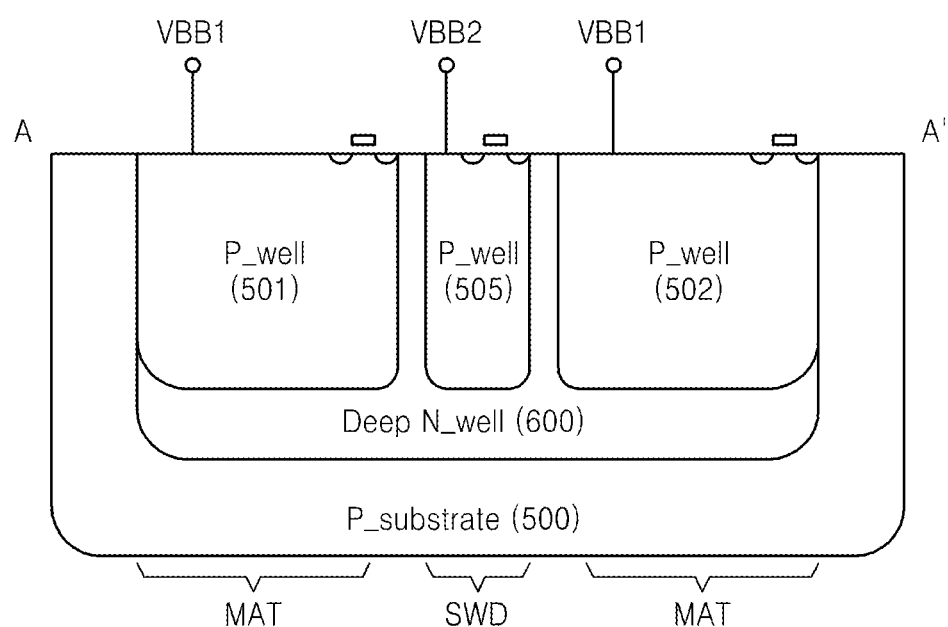
FIGS. 11A and 11B illustrate a well structure of a semiconductor memory device according to example embodiments.
Figure 11B:
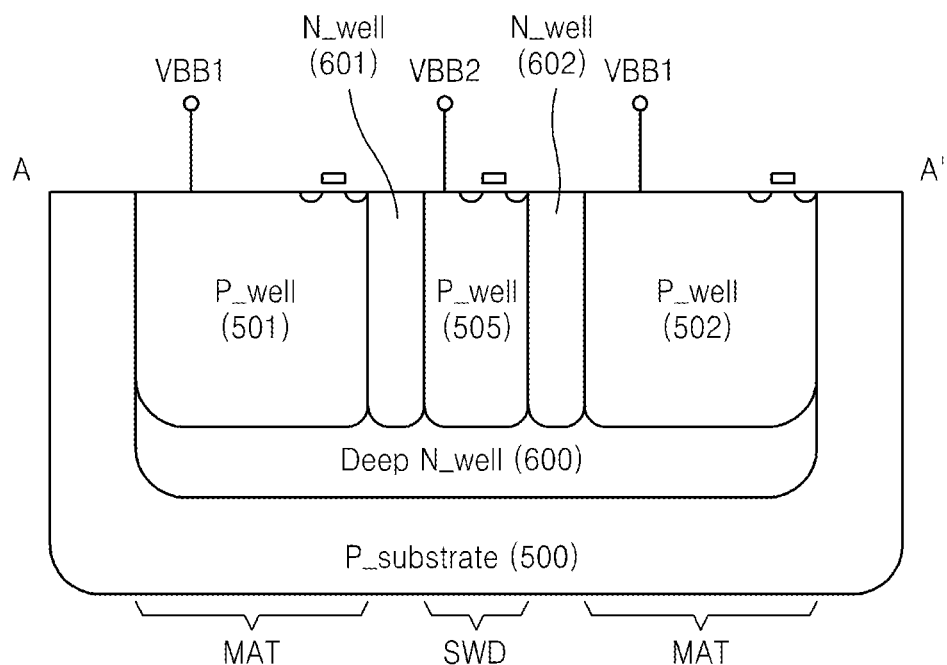

FIGS. 11A and 11B illustrate a well structure of a semiconductor memory device according to example embodiments, the cross-sectional views being taken along line A-A' of FIG. 5.

Referring to FIG. 11A, a deep N-well 600 is formed in a P-substrate 500, and has therein P-wells 501 and 502 for MAT regions separated from each other. A P-well 505 for an SWD region is interposed between the P-wells 501 and 502. The cell transistors CT shown in FIG. 2 are formed in the P-wells 501 and 502 for MAT regions, while the NMOS transistors M1 through M4 shown in FIG. 3 are formed in the P-well 505 for the SWD region.

Referring to FIG. 11B, first and second N-well isolation guard rings 601 and 602 are disposed between the P-well 501 for the MAT region and the P-well 505 for the SWD region and between the P-well 502 for the MAT region and the P-well 505 for the SWD region, respectively.

Referring to FIGS. 11A and 11B, a first voltage VBB1 is applied as a bias voltage to the P-wells 501 and 502 for the MAT regions, and a second voltage VBB2 is applied as a bias voltage to the P-well 505 for the SWD region. The first voltage VBB1 is different from the second voltage VBB2. The first voltage VBB1 is determined as an optimal back bias voltage of a cell transistor CT by considering a balance between static and dynamic characteristics of the MAT regions. The second voltage VBB2 is an optimal back bias voltage determined by considering margins of NMOS transistor characteristics in a core area. For instance, the first voltage VBB1 may be set to about −1.2 V to about −0.5 V, and the second voltage VBB2 may be set to −1.2 V to about −0.5 V.

Figure 12:
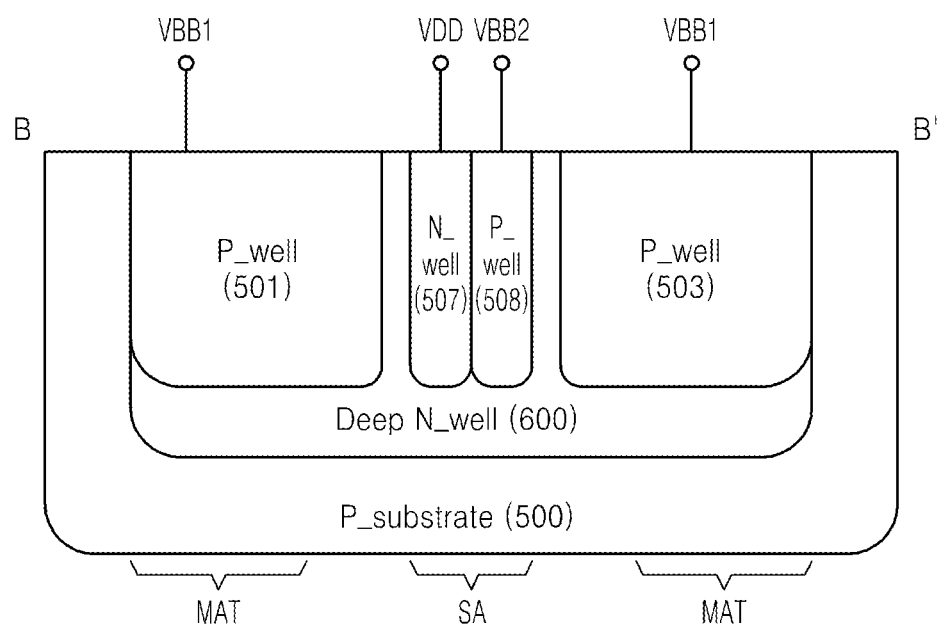
FIG. 12 illustrates a well structure of a semiconductor memory device according to another example embodiment.

FIG. 12 illustrates a well structure of a semiconductor memory device according to another example embodiment, the cross-sectional view being taken along line B-B' of FIG. 5.

Referring to FIG. 12, a deep N-well 600 is formed in a P-substrate 500 and has therein P-wells 501 and 503 for MAT regions separated from each other. N- and P-wells 507 and 508 for an SA region are disposed between the P-wells 501 and 503. The first and second PMOS transistors P11 and P12 of the sense amplifier SA shown in FIG. 4 are formed in the N-well 507 for the SA region, and the first and second NMOS transistors N11 and N12 of the sense amplifier SA are formed in the P-well 508.

A first voltage VBB1 is applied as a bias voltage to the P-wells 501 and 503 for the MAT regions, and a second voltage VBB2 is applied as a bias voltage to the P-well 508 for the SA region. On the other hand, a supply voltage VDD is applied as a bias voltage to the N-well 507 for the SA region. The P-wells 501 and 503 biased to the first voltage VBB1 may be doped at different doping concentrations than the P-well 508 biased to the second voltage VBB2.

The first voltage VBB1 is different from the second voltage VBB2. The first voltage VBB1 is determined as an optimal back bias voltage of a cell transistor CT by considering a balance between static and dynamic characteristics of the MAT regions. The second voltage VBB2 is an optimal back bias voltage determined by considering margins of NMOS transistor characteristics in the sense amplifier SA. For instance, the first voltage VBB1 may be set to about −1.2 V to about −0.5 V, and the second voltage VBB2 may be set to about −0.6 V to about 0V.

Figure 13A:
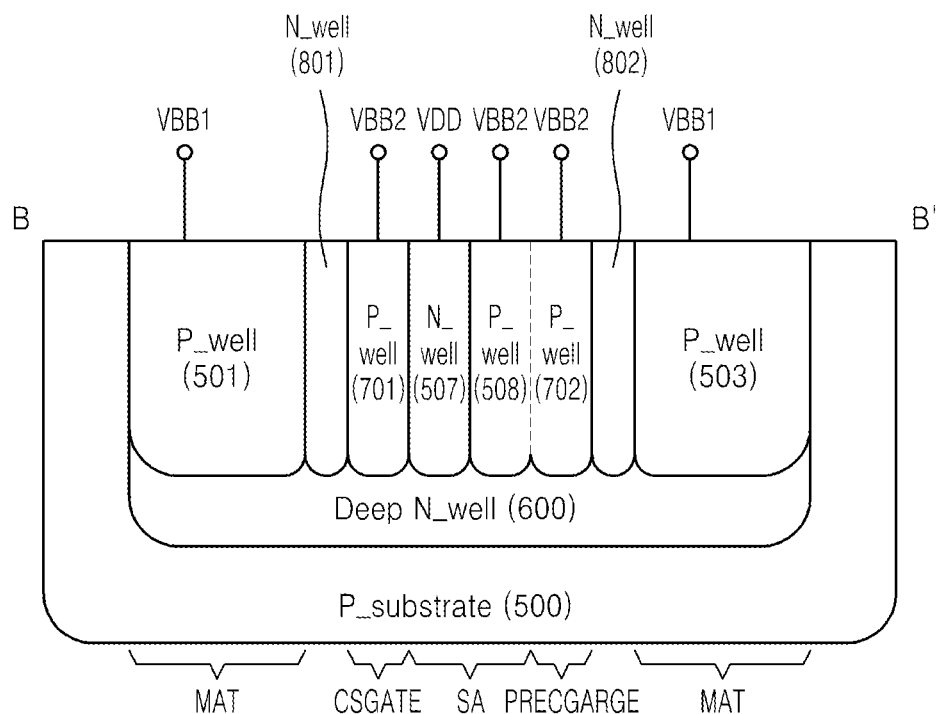
FIG. 13A illustrates a well structure of a semiconductor memory device according to another example embodiment.

FIG. 13A illustrates a well structure of a semiconductor memory device according to another example embodiment, the cross-sectional view being taken along line B-B' of FIG. 5.

Referring to FIG. 13A, a deep N-well 600 is formed in a P-substrate 500 and has therein P-wells 501 and 503 for MAT regions separated from each other. N- and P-wells 507 and 508 for an SA region are disposed between the P-wells 501 and 503. The first and second PMOS transistors P11 and P12 of the sense amplifier SA shown in FIG. 4 are formed in the N-well 507 for the SA region, and the first and second NMOS transistors N11 and N12 of the sense amplifier SA are formed in the P-well 508.

A P-well 701 for a column select circuit CSGATE is disposed between the P-well 501 for the MAT region and the N-well 507 for the SA region. The P-well 701 includes the first and second NMOS transistors N31 and N32 of the column select circuit CSGATE shown in FIG. 4. A P-well 702 for a bit line precharge circuit PRECHARGE is interposed between the P-well 503 for the MAT region and the P-well 508 for the SA region. The P-well 702 includes the first through third NMOS transistors N21 through N23 of the bit line precharge circuit PRECHARGE shown in FIG. 4.

First and second N-well isolation guard rings 801 and 802 are disposed between the P-well 501 for the MAT region and the P-well 710 for the column select circuit CSGATE and between the P-well 503 for the MAT region and the P-well 702 for the bit line precharge circuit PRECHARGE.

A first voltage VBB1 is applied as a bias voltage to the P-wells 501 and 503 for the MAT regions, and a second voltage VBB2 is applied as a bias voltage to the P-well 508 for the SA region, the P-well 701 for the column select circuit CSGATE, and the P-well 702 for the bit line precharge circuit PRECHARGE. On the other hand, a supply voltage VDD is applied as a bias voltage to the N-well 507 for the SA region. The P-wells 501 and 503 biased to the first voltage VBB1 may be doped at different doping concentrations than the P-wells 508, 701, and 702 biased to the second voltage VBB2. The adjacent P-wells 508 and 702 biased to the second voltage VBB2 may be merged into a single P-well.

The first voltage VBB1 is different from the second voltage VBB2. The first voltage VBB1 is determined as an optimal back bias voltage of a cell transistor CT by considering a balance between static and dynamic characteristics of the MAT regions. The second voltage VBB2 is an optimal back bias voltage determined by considering margins of NMOS transistor characteristics in a core area. For instance, the first voltage VBB1 may be set to about −1.2 V to about −0.5 V, and the second voltage VBB2 may be set to about −0.6 V to about 0V.

Figure 13B:
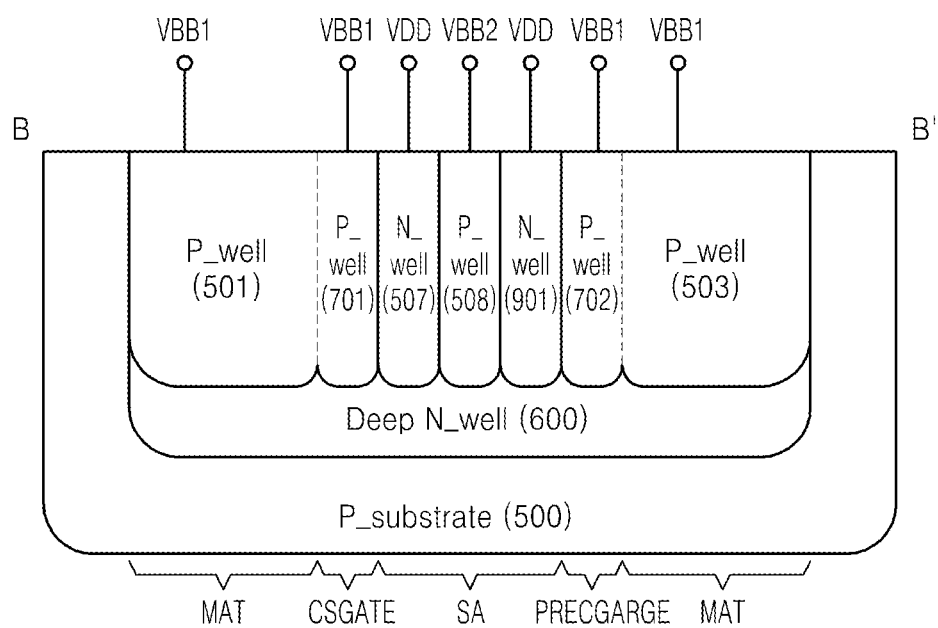
FIG. 13B illustrates a well structure of a semiconductor memory device according to another example embodiment.

FIG. 13B illustrates a well structure of a semiconductor memory device according to another example embodiment and is a cross-sectional view taken along line B-B' of FIG. 5.

Referring to FIG. 13B, a deep N-well 600 is formed in a P-substrate 500 and has therein P-wells 501 and 503 for MAT regions separated from each other. A P-well 701 for a column select circuit CSGATE, an N-well 507 for an SA region, and a P-well 702 for a precharge circuit PRECHARGE are disposed between the P-wells 501 and 503. An N-well isolation guard ring 901 is interposed between the P-well 508 for the SA region and the P-well 702 for the bit line precharge circuit PRECHARGE.

A first voltage VBB1 is applied as a bias voltage to the P-wells 501 and 503 for the MAT regions and the P-wells 701 and 702 for the column select circuit CSGATE and the bit line precharge circuit PRECHARGE, and a second voltage VBB2 is applied as a bias voltage to the P-well 508 for the SA region. On the other hand, a supply voltage VDD is applied as a bias voltage to the N-well 507 for the SA region. The P-wells 501, 503, 701, and 702 biased to the first voltage VBB1 may be doped at different doping concentrations than the P-well 508 biased to the second voltage VBB2. The adjacent P-wells 501 and 701 and 503 and 702 biased to the first voltage VBB1 may be merged into a single P-well, respectively.

The first voltage VBB1 is different from the second voltage VBB2. The first voltage VBB1 is determined as an optimal back bias voltage of a cell transistor CT by considering a balance between static and dynamic characteristics of the MAT regions. The second voltage VBB2 is an optimal back bias voltage determined by considering margins of NMOS transistor characteristics in the SA region. For instance, the first voltage VBB1 may be set to about −1.2 V to about −0.5 V, and the second voltage VBB2 may be set to about −0.6 V to about 0V.

Figure 14:
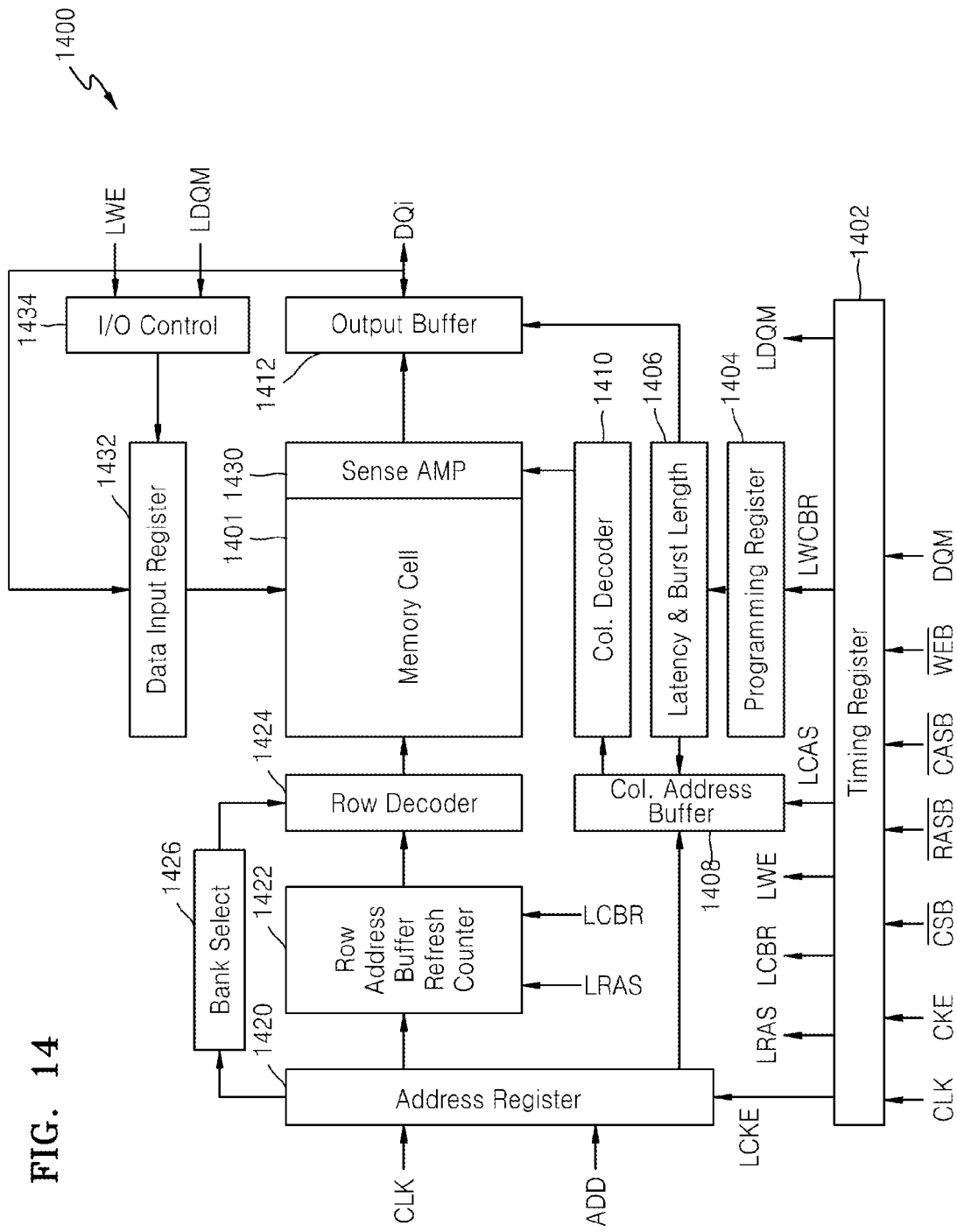
FIG. 14 is a block diagram of a semiconductor memory device according to an example embodiment.

FIG. 14 illustrates a block diagram of a semiconductor memory device according to an example embodiment.

As illustrated in FIG. 14, a memory device configured where a P-well bias for a MAT region is separate from a P-well bias for an SA region may be included in a semiconductor memory device such as a Double Data Rate Synchronous Dynamic Random Access Memory (DDR-SDRAM).

Referring to FIG. 14, a DDR-SDRAM 1400 includes a memory cell array 1401 having DRAM cells and a plurality of circuit blocks for driving the DRAM cells. For example, a timing register 1402 may be activated when a chip select signal CS switches from an inactive state (e.g., logic high) to an active state (e.g., logic low). The timing register 1402 receives command (CMD) signals including a clock signal CLK, a clock enable signal CKE, a chip select signal CSB, a row address strobe signal RASB, a column address strobe signal CASB, a write enable signal WEB, and a data I/O mask signal DQM from the outside, and processes the CMD signals to produce a plurality of internal command signals LRAS, LCBR, LWE, LCAS, LWCBR, and LDQM.

Some of the internal command signals generated by the timing register 1402 are stored in a programming register 1404. For example, latency information or burst length information related to data output may be stored in the programming register 1404. The internal command signals stored in the programming register 1404 may be provided to a latency/burst length controller 1406, which in turn transmits a control signal for controlling a latency or burst length for data output to a column decoder 1410 or an output buffer 1412 through a column address buffer 1408.

An address register 1420 receives an address signal ADD from the outside. A row address signal may be provided to a row decoder 1424 through a row address buffer 1422, while a column address signal may be provided to the column decoder 1410 through the column address buffer 1408. The row address buffer 1422 may also receive a refresh address signal from a refresh counter (not shown) in response to refresh commands LRAS and LCBR, and provides one of the row address signal and the column address signal to the row decoder 1424. The address register 1420 also transmits a bank signal for selecting a bank to a bank selector 1426.

The row decoder 1424 decodes the row address signal or the refresh address signal received from the row address buffer 1422 and activates a word line of the memory cell array 1401. The column decoder 1410 decodes the column address signal and selects a bit line of the memory cell array 1401. For example, the DDR-SDRAM 1400 may have column selection lines to select a bit line of the memory cell array 1401.

A sense amplifier amplifies data of a memory cell selected by the row decoder 1424 and the column decoder 1410 and transmits the amplified data to the output buffer 1412. Data, which will be written to a data cell, is transmitted to the memory cell array 1401 through a data input register 1432. An I/O controller 1434 may control the transmission of data through the data input register 1432.

A first voltage VBB1 is used as a bias voltage to P-wells for forming the memory cell array 1401, while a second voltage VBB2 is used as a bias voltage to P-wells for forming the sense amplifier 1430. The P-wells for the memory cell array 1401 may be doped at different doping concentrations than the P-wells for the sense amplifier 1430. The first and second voltages VBB1 and VBB2 are different from each other.

Figure 15:
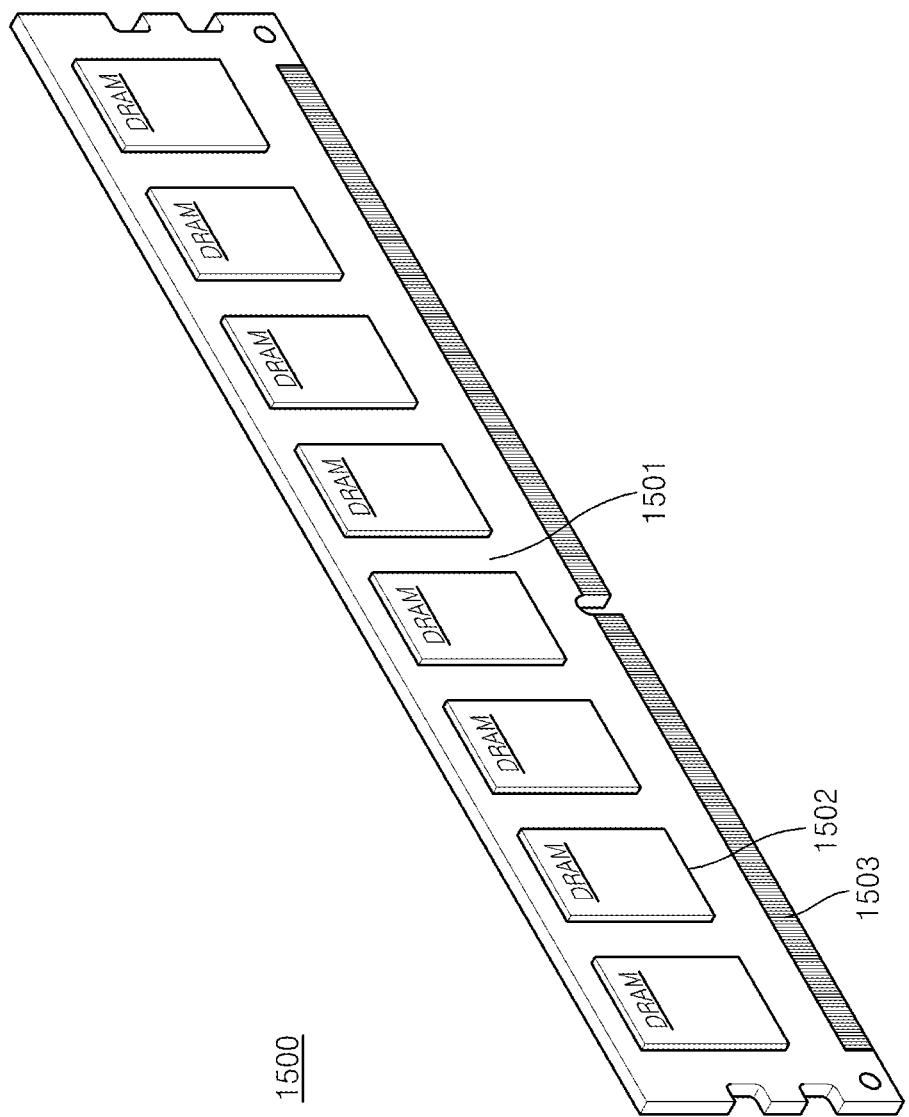
FIGS. 15 through 17 are diagrams of memory modules including semiconductor memory devices according to example embodiments.
Figure 16:
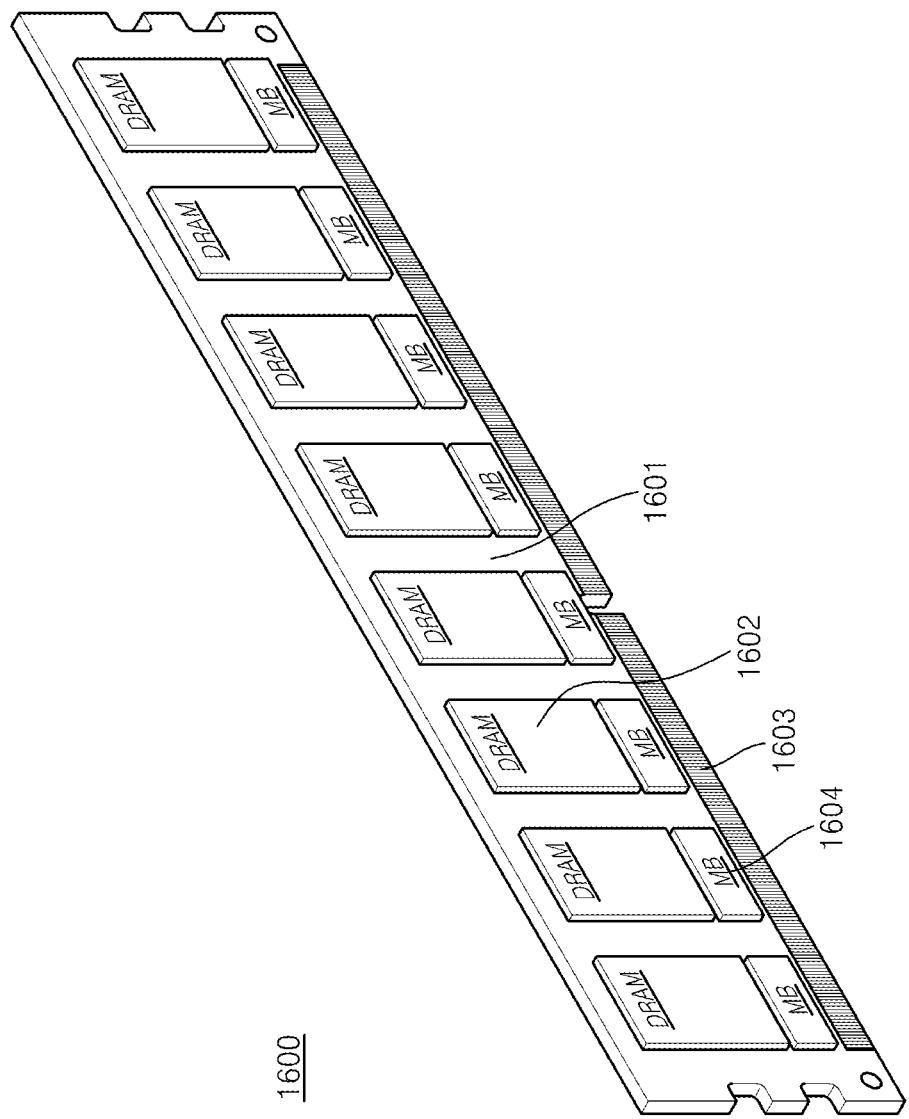
Figure 17:
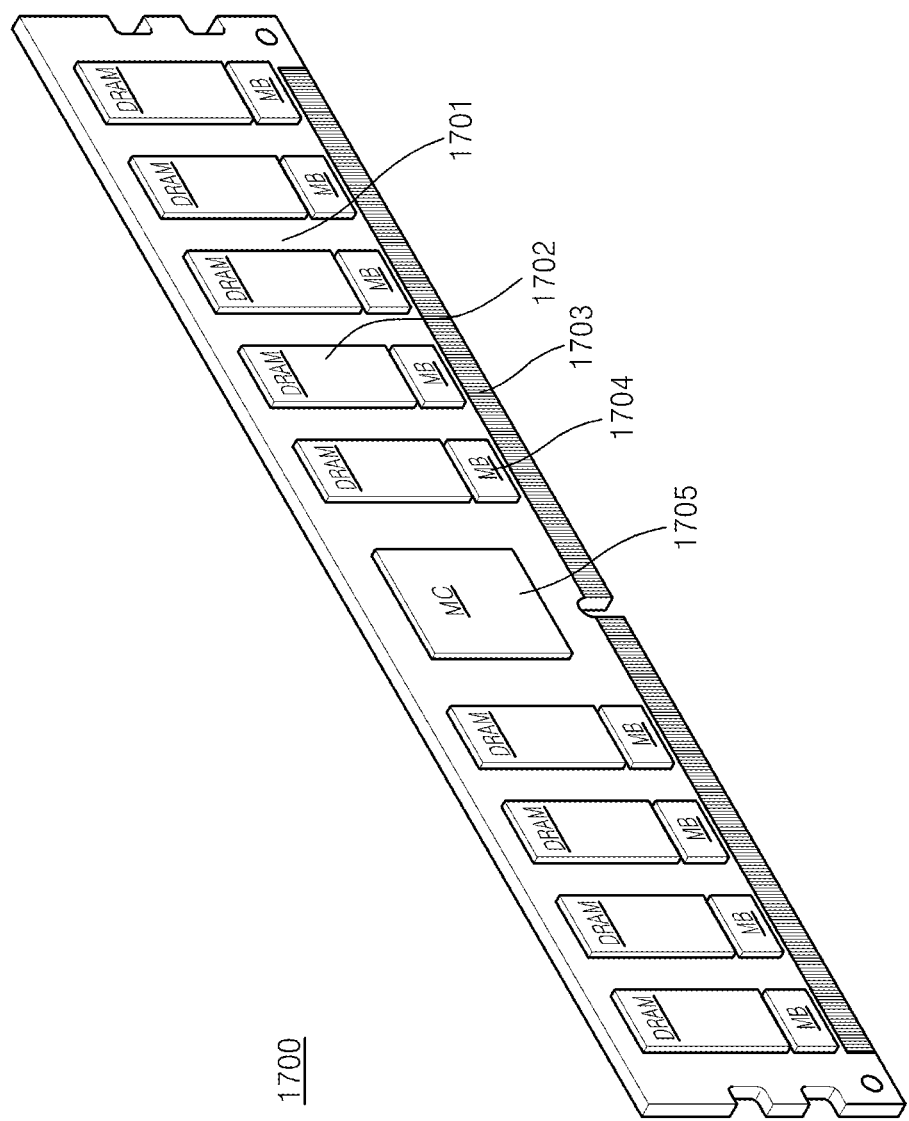

FIGS. 15 through 17 are diagrams of memory modules 1500, 1600, and 1700 according to example embodiments, each including DRAM chips configured where a P-well bias for a memory cell array region is separate from a P-well bias for a sense amplifier region.

Referring to FIG. 15, the memory module 1500 may include a printed circuit board (PCB) 1501, a plurality of DRAM chips 1502, and a connector 1503. The plurality of DRAM chips 1502 may be attached to upper and lower surfaces of the PCB 1501. The connector 1503 is electrically connected to the plurality of DRAM chips 1502 via conductive lines (not shown). The connector 1503 may be connected to a slot in an external host.

In each of the plurality of DRAM chips 1502, a first voltage VBB1 is used as a bias voltage to a P-well for forming a memory cell array, while a second voltage VBB2 is used as a bias voltage to a P-well for forming a sense amplifier. The P-well for the memory cell array may be doped at different doping concentrations than the P-well for the sense amplifier. The first and second voltages VBB1 and VBB2 are different voltages.

Referring to FIG. 16, the memory module 1600 may include a PCB 1601, a plurality of DRAM chips 1602, a connector 1603, and a plurality of buffer chips 1604. Each of the plurality of buffer chips 1604 may be disposed between a corresponding one of the plurality of DRAM chips 1602 and the connector 1603. The DRAM chips 1602 and the buffer chips 1604 may be provided at upper and lower surfaces of the PCB 1601 and connected to each other through a plurality of via holes (not shown). The plurality of DRAM chips 1502 may be attached to upper and lower surfaces of the PCB 1501. The connector 1503 is electrically connected to the plurality of DRAM chips 1502 via conductive lines (not shown). The connector 1503 may be connected to a slot in an external host.

In each of the plurality of DRAM chips 1602, a first voltage VBB1 may be used as a bias voltage to a P-well for forming a memory cell array while a second voltage VBB2 may be used as a bias voltage to a P-well for forming a sense amplifier. The P-well for the memory cell array may be doped at different doping concentrations than the P-well for the sense amplifier. The first and second voltages VBB1 and VBB2 are different voltages.

Each of the buffer chips 1604 may store the result of testing the characteristics of a corresponding DRAM chip 1602 that is connected to the buffer chip 1604. The buffer chip 1604 may use information about the characteristics of the corresponding DRAM chip 1602 to manage operations of the DRAM chip 1602, thereby mitigating adverse effects of a weak cell or page on the performance of the DRAM chip 1602. For example, the buffer chip 1604 may have a storage therein and can repair weak cells or pages in the DRAM chip 1602.

Referring to FIG. 17, the memory module 1700 may include a PCB 1701, a plurality of DRAM chips 1702, a connector 1703, a plurality of buffer chips 1704, and a controller 1705. The controller 1705 communicates with the DRAM chips 1702 and the buffer chips 1704 and controls operating modes of the DRAM chips 1702. The controller 1705 may use a mode register of the DRAM chip 1705 to control various functions, features, and modes.

In each of the plurality of DRAM chips 1702, a first voltage VBB1 may be used as a bias voltage to a P-well for forming a memory cell array while a second voltage VBB2 may be used as a bias voltage to a P-well for forming a sense amplifier. The P-well for the memory cell array may be doped at different doping concentrations than the P-well for the sense amplifier. The first and second voltages VBB1 and VBB2 are different voltages.

The memory modules 1500, 1600, and 1700 (DRAM) may be applied to different types of memory modules including a single in-line memory module (SIMM), a dual in-line memory module (DIMM), a small-outline DIMM (SO-DIMM), an unbuffered DIMM (UDIMM), a fully-buffered DIMM (FBDIMM), a rank-buffered DIMM (RBDIMM), a load-reduced DIMM (LRDIMM), a mini-DIMM, and a micro-DIMM.

Figure 18:
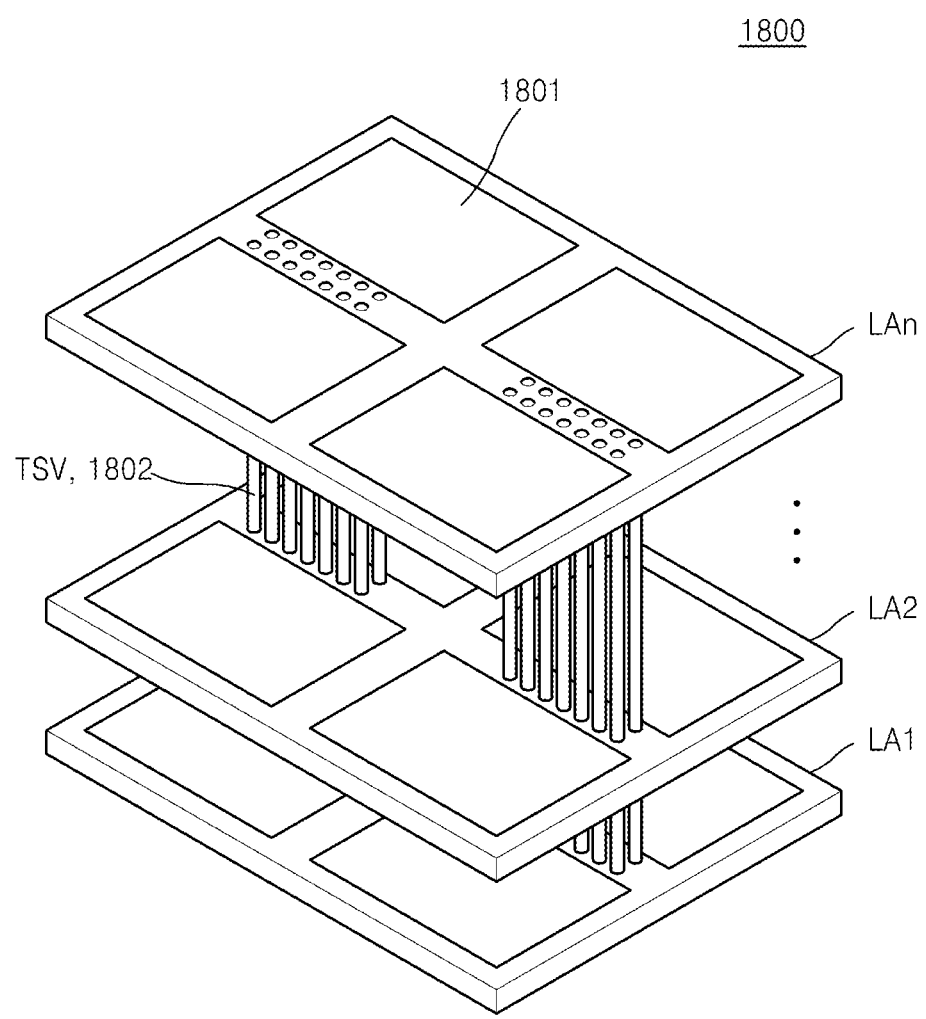
FIG. 18 is a stack-type semiconductor device having a plurality of stacked layers according to an example embodiment.

FIG. 18 is a stack-type semiconductor device 1800 having a plurality of stacked DRAM semiconductor layers configured where a P-well bias for a memory cell array region is separate from a P-well bias for a sense amplifier region, according to an example embodiment.

Referring to FIG. 18, the semiconductor device 1800 according to the present embodiment includes a plurality of DRAM semiconductor layers LA1 through LAn. Each of the plurality of DRAM semiconductor layers LA1 through LAn may be a memory chip including memory cell arrays 1801, each having a plurality of DRAM cells. Some of the DRAM semiconductor layers LA1 through LAn may be master chips for interfacing with an external controller while the remaining semiconductor layers may be slave chips for storing data. In FIG. 18, the lowest DRAM semiconductor layer LA1 may be a master chip, and the remaining semiconductor layers LA2 through LAn may be slave chips.

The plurality of DRAM semiconductor layers LA1 through LAn may transmit/receive signals between each other via a through silicon via (TSV), and the DRAM semiconductor layer LA1 acting as a master chip may communicate with an external memory controller (not shown) through a conductive unit (not shown) disposed on an outer surface thereof.

The transmission of signals between the plurality of DRAM semiconductor layers LA1 through LAn may be performed by using optical IO connection. For example, the DRAM semiconductor layers LA1 through LAn may be connected to each other by exploiting a radiative method using radio frequency (RF) waves or ultrasound waves, inductive coupling using magnetic induction, or a non-radiative method using magnetic resonance.

The radiative type forwards a signal wirelessly by using an antenna such as a monopole antenna or a planar inverted-F antenna (PIFA). Radiation occurs as an electric field or a magnetic field, which changes over time, influences each other, and an antenna having the same frequency, if any, may receive a signal suitably for polarization characteristics of incident waves. The inductive coupling type generates a strong magnetic field by winding a coil several times, and a coil, which resonates at a similar frequency, is close to the strong magnetic field, thus generating coupling. The non-radiative type uses evanescent wave coupling which moves electromagnetic waves between two media that resonate at the same frequency through a near electromagnetic field In each of the plurality of DRAM semiconductor layers LA1 through LAn, a first voltage VBB1 may be used as a bias voltage to a P-well for forming a memory cell array while a second voltage VBB2 may be used as a bias voltage to a P-well for forming a sense amplifier. The P-well for the memory cell array may be doped at different doping concentrations than the P-well for the sense amplifier. The first and second voltages VBB1 and VBB2 are different voltages.

Each of the DRAM chips 1502, 1602, and 1702 in the memory modules 1500, 1600, and 1700 described above with reference to FIGS. 15 through 17 may include the plurality of DRAM semiconductor layers LA1 through LAn.

Figure 19:
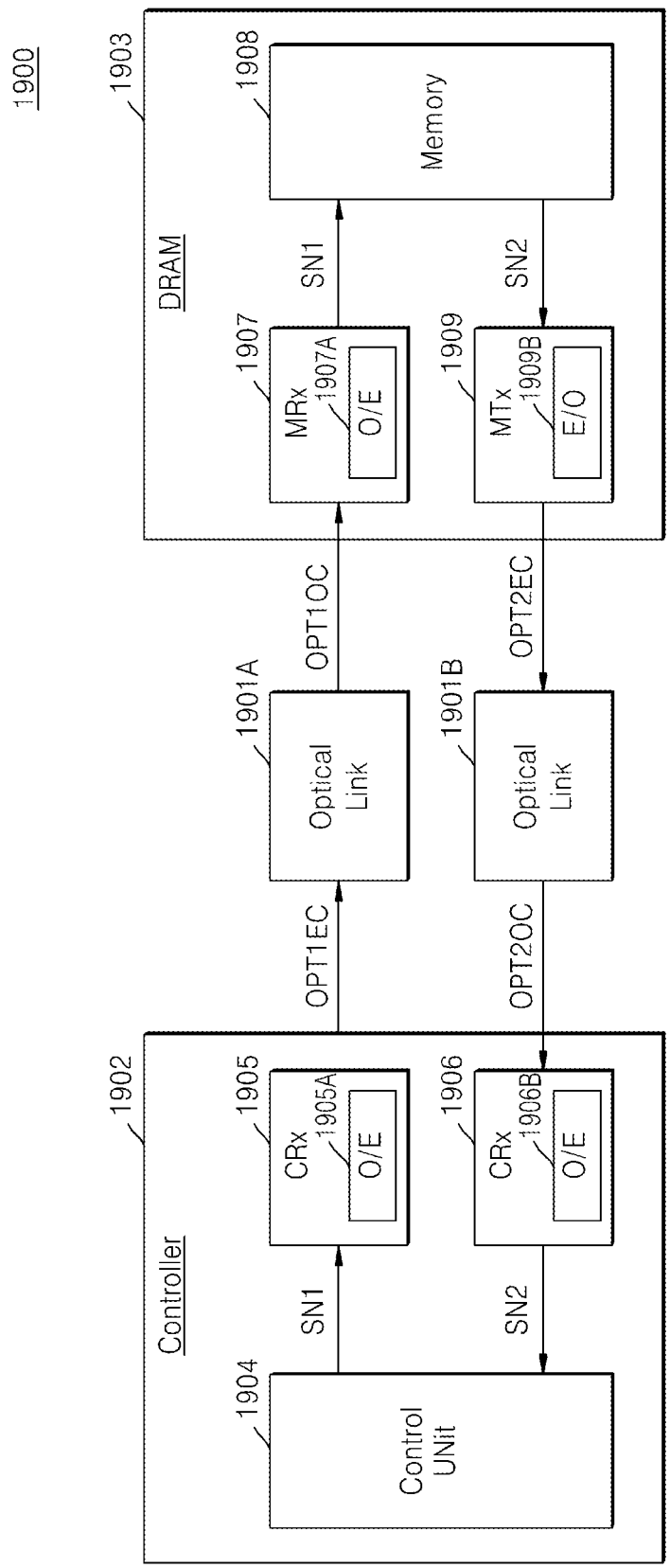
FIG. 19 is a diagram of a memory system including semiconductor memory devices according to example embodiments.

FIG. 19 is a diagram of a memory system 1900 including a DRAM 1903 configured where a P-well bias for a MAT region is separate from a P-well bias for an SA region, according to an example embodiment.

Referring to FIG. 19, the memory system 1900 may include optical links 1901A and 1901B, a controller 1902, and the DRAM 1903. The optical links 1901A and 1901B interconnect the controller 1902 with the DRAM 1903. The controller 1902 includes a control unit 1904, a first transmitter 1905, and a first receiver 1906. The control unit 1904 transmits a first electrical signal SN1 to the first transmitter 1905. The first electrical signal SN1 may include command signals, clocking signals, address signals, or write data, which are transmitted to the DRAM 1903.

The first transmitter 1905 includes a first optical modulator 1905A that converts the first electrical signal SN1 into a first optical transmitting signal OTP1EC and transmits the same to the optical link 1901A. The first optical transmitting signal OTP1EC is transmitted via the optical link 1901A using serial communication. The first receiver 1906 includes a first optical de-modulator 1906B which converts a second optical receiving signal OPT2OC received via the optical link 1901B into a second electrical signal SN2 and transmits the same to the control unit 1904.

The DRAM 1903 includes a second receiver 1907, a memory region 1908 including memory cell arrays, and a second transmitter 1909. In the DRAM 1903, a first voltage VBB1 may be used as a bias voltage to a P-well for forming a memory cell array, while a second voltage VBB2 may be used as a bias voltage to a P-well for forming a sense amplifier. The P-well for the memory cell array may be doped at different doping concentrations than the P-well for the sense amplifier. The first and second voltages VBB1 and VBB2 are different voltages. The second receiver 1907 includes a second optical de-modulator 1907A which converts a first optical receiving signal OPT1OC into the first electrical signal SN1 and transmits the same to the memory region 1908.

The memory region 1908 writes write data to a memory cell in response to the first electrical signal SN1 or transmits data read out from the memory region 1908 to the second transmitter 1909 as a second electrical signal SN2. The second electrical signal SN2 may consist of clocking signals and read data, which are transmitted to the controller 1902. The second transmitter 1909 includes a second optical modulator 1909B which converts the second electrical signal SN2 into a second optical transmitting signal OPT2EC and transmits the same to the optical link 1901B. The second optical transmitting signal OPT2EC is transmitted via the optical link 1901B using serial communication.

Figure 20:
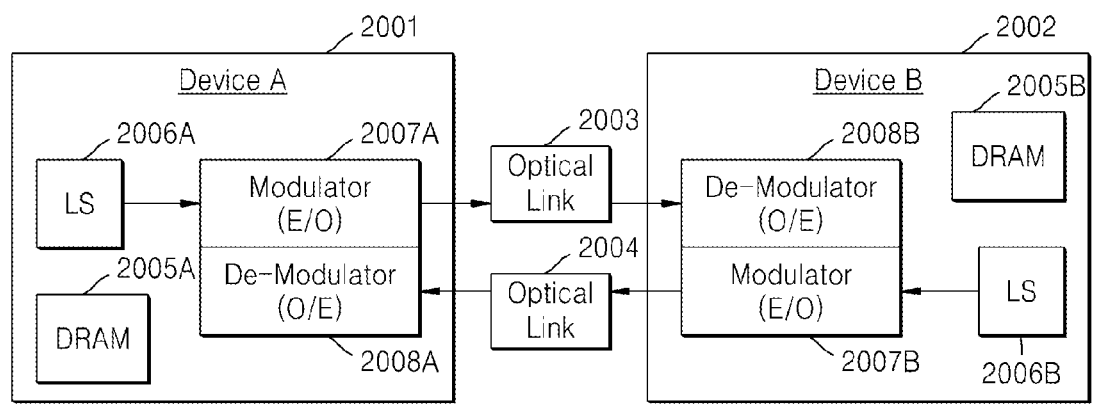
FIG. 20 is a diagram of a data processing system including semiconductor memory devices according to example embodiments.

FIG. 20 is a diagram of a data processing system 2000 including a DRAM configured where a P-well bias for a MAT region is separate from a P-well bias for an SA region, according to an example embodiment.

Referring to FIG. 20, the data processing system 2000 according to the present embodiment includes a first device 2001, a second device 2002, and a plurality of optical links 2003 and 2004. The first and second devices 2001 and 2002 transmit and receive optical signals via serial communication.

The first device 2002 includes a DRAM 2005A, a first light source 2006A, a first optical modulator 2007A, which performs an electric to optical conversion, and a first optical de-modulator 2008A, which performs an optical to electric conversion. The second device 2002 includes a DRAM 2005B, a second light source 2006B a second optical modulator 2007B, and a second optical de-modulator 2008B.

In the DRAMs 2005A and 2005B, a first voltage VBB1 may be used as a bias voltage to a P-well for forming a memory cell array, while a second voltage VBB2 may be used as a bias voltage to a P-well for forming a sense amplifier. The P-well for the memory cell array may be doped at different doping concentrations than the P-well for the sense amplifier. The first and second voltages VBB1 and VBB2 are different voltages.

The first and second light sources 2006A and 2006B output an optical signal having a constant waveform. The first and second light sources 2006A and 2006B may be a multi-wavelength Distributed Feed-Back Laser Diode (DFB-LD) or a multi-wavelength Fabry Perot Laser Diode (FP-LD).

The first optical modulator 2007A converts data to be transmitted into an optical transmitting signal and transmits the optical transmitting signal to the optical link 2003. The first optical modulator 2007A may modulate a wavelength of an optical signal received from the first light source 2006A according to data to be transmitted. The first optical de-modulator 2008A receives an optical signal from the second de-modulator 2007B of the second device 2002 via the optical link 2004, converts the optical signal into an electrical signal, and outputs the electrical signal.

The second optical modulator 2007B of the second device 2002 converts data to be transmitted into an optical transmitting signal and transmits the optical transmitting signal to the optical link 2004. The second optical modulator 2007B may modulate a wavelength of an optical signal received from the second light source 2006B according to data to be transmitted. The second optical de-modulator 2008B receives an optical signal from the first optical modulator 2007A of the first device 2001 via the optical link 2003, converts the optical signal into an electrical signal, and outputs the electrical signal.

Figure 21:
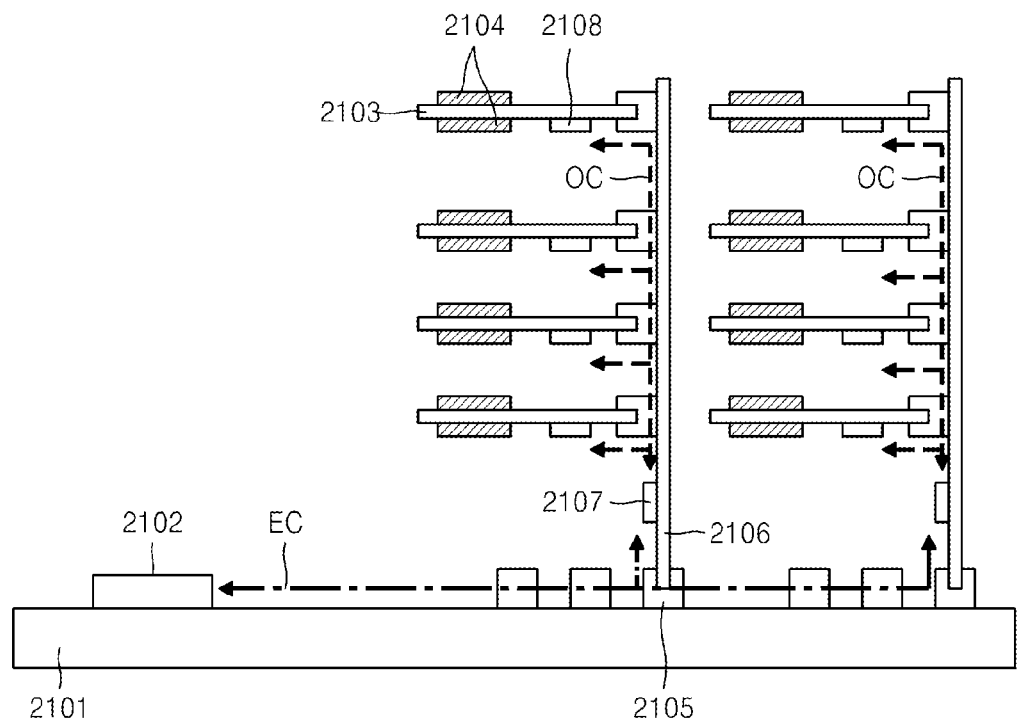
FIG. 21 is a diagram of a server system including semiconductor memory devices according to example embodiments.

FIG. 21 is a diagram of a server system 2100 including a DRAM configured where a P-well bias for a MAT region is separate from a P-well bias for an SA region, according to an example embodiment.

Referring to FIG. 21, the server system 2100 may include a memory controller 2102 and a plurality of memory modules 2103. Each of the plurality of memory modules 2103 includes a plurality of DRAM chips 2104. In the DRAM chip 2104, a first voltage VBB1 may be used as a bias voltage to a P-well for forming a memory cell array, while a second voltage VBB2 may be used as a bias voltage to a P-well for forming a sense amplifier. The P-well for the memory cell array may be doped at different doping concentrations than the P-well for the sense amplifier. The first and second voltages VBB1 and VBB2 are different voltages.

The server system 2100 is configured to secure a second circuit substrate 2106 to sockets 2105 of a first circuit substrate 2101. The server system 2100 may have a channel structure in which a single second circuit substrate 2106 is connected to the first circuit substrate 2101 for each signal channel. However, example embodiments are not limited thereto, and the server system 2100 may have various other channel structures.

The transmission of signals between the memory modules 2013 may be performed by using optical IO connection. For the optical IO connection, the server system 2100 may further include an electric-to-optical conversion unit 2107, and each of the memory modules 2103 may further include an optical-to-electric conversion unit 2108.

The memory controller 2102 is connected to the electric-to-optical conversion unit 2107 via an electrical channel EC. The electric-to-optical conversion unit 2107 then transforms an electrical signal received from the memory controller 2102 via the electrical channel EC into an optical signal and transmits the optical signal to an optical channel OC. The electric-to-optical conversion unit 2107 also transforms the optical signal received through an optical channel OC into an electrical signal and transmits the electrical signal to the electrical channel EC.

The memory modules 2103 are connected to the electric-to-optical conversion unit 2107 via the optical channel OC. The optical-to-electric conversion unit 2108 then transforms the optical signal applied to the memory modules 2103 into an electrical signal and transmits the electrical signal to the DRAM chips 2104. The server system 2100 including the optically-coupled memory modules 2103 may provide a high storage capacity and a high processing rate.

Figure 22:
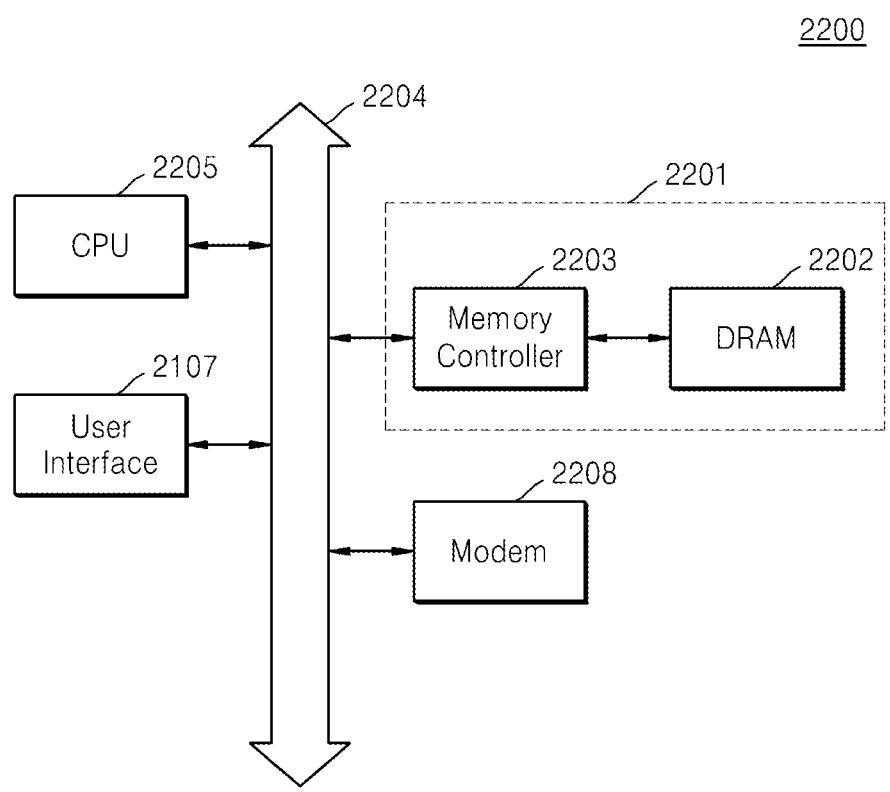
FIG. 22 is a diagram of a computer system equipped with semiconductor memory devices according to example embodiments.

FIG. 22 is a diagram of a computer system 2200 equipped with a DRAM configured where a P-well bias for a memory cell array region is separate from a P-well bias for a sense amplifier region, according to an example embodiment.

Referring to FIG. 22, the computer system 2200 may be mounted in a mobile device or a desktop computer. The computer system 2200 includes a DRAM memory system 2201 that is electrically connected to a system bus 2204, a central processing unit (CPU) 2205, a user interface 2207, and a modem 2208 such as a baseband chipset. The computer system 2200 may further include an application chipset, a camera image processor (CIS), and an I/O unit.

The user interface 2207 may be an interface for transmitting/receiving data to/from a communication network. The user interface 2207 may enable a wired or wireless connection and include an antenna or a wired/wireless transceiver. Data that is provided through the user interface 2207 or the modem 2208 or processed by the CPU 2205 may be stored in the DRAM memory system 2201.

The DRAM memory system 2201 may include a DRAM 2202 and a memory controller 2203. Data processed by the CPU 2205 or externally input data may be stored in the DRAM 2202. In the DRAM 2202, a first voltage VBB1 may be used as a bias voltage to a P-well for forming a memory cell array, while a second voltage VBB2 may be used as a bias voltage to a P-well for forming a sense amplifier. The P-well for the memory cell an array may be doped at different doping concentrations than the P-well for the sense amplifier. The first and second voltages VBB1 and VBB2 are different voltages.

When the computer system 2200 performs wireless communication, it may be used in different types of communication systems including Code Division Multiple Access (CDMA), Global System for Mobile Communications (GSM), North American Multiple Access (NADC), and CDMA2000 communication systems. The computer system 2200 may be installed on information processing devices such as Personal Digital Assistants (PDAs), portable computers, web tablets, digital cameras, Portable Media Players (PMPs), mobile phones, wireless phones, or laptop computers.

In general, a system includes a separate cache memory having a high processing speed and a separate storage such as RAM for storing large amounts of data. However, a DRAM system according to example embodiments eliminates the need for such memories. In other words, a memory device including a DRAM allows high-speed storage of large amounts of data to thereby simplify the configuration of a computer system.

While the inventive concepts have been particularly shown and described with reference to example embodiments thereof, it will be understood that various changes in form and details may be made therein without departing from the spirit and scope of the following claims. Thus, the scope is defined only by the appended claims.

What is claimed is:

1. A semiconductor memory device comprising:
a semiconductor substrate;
a first well of a first conductivity type formed in the semiconductor substrate and having a memory cell formed therein; and
a second well of the first conductivity type formed in the semiconductor substrate and having formed therein a sense amplifier configured to sense and amplify data from the memory cell,
wherein the first well is biased to a first voltage selected based on a junction leakage current and a transistor leakage current associated with the memory cell, and the second well is biased to a second voltage selected based on margins of AC timing parameters and standby characteristics of NMOS transistors associated with the sense amplifier such that the first voltage and the second voltage are different voltages.

2. The device of claim 1, wherein the first voltage is lower than the second voltage.

3. The device of claim 1, wherein the first and second wells have different doping concentrations.

4. The device of claim 1, further comprising:
a third well of a second conductivity type, which is formed in the semiconductor substrate and has the sense amplifier formed therein,
wherein the third well is biased to a third voltage different from the first and second voltages.

5. The device of claim 4, wherein the first conductivity type is a P-type, and the second conductivity type is an N-type.

6. The device of claim 1, further comprising:
a third well of a second conductivity type formed between the first and second wells in the semiconductor substrate, the third well configured to isolate the first well from the second well.

7. The device of claim 6, further comprising:
a fourth well of the first conductivity type, which is formed between the second and third wells in the semiconductor substrate and has a circuit that is connected to the sense amplifier therein,
wherein the fourth well is biased to the second voltage.

8. The device of claim 7, wherein the second and fourth wells have a same doping concentration.

9. The device of claim 6, further comprising:
a fourth well of the first conductivity type, which is formed between the first and third wells in the semiconductor substrate and has a circuit that is connected to the sense amplifier therein,
wherein the fourth well is biased to the first voltage.

10. The device of claim 9, wherein the second and fourth wells have a same doping concentration.

11. The device of claim 9, wherein the circuit is one of a precharge circuit configured to precharge a bit line and a complementary bit line of the memory cell and a column select circuit configured to connect the bit line and the complementary bit line to an input/output (I/O) line and a complementary I/O line, respectively.

12. A semiconductor memory device comprising:
a semiconductor substrate;
a first well of a first conductivity type formed in the semiconductor substrate and having a memory cell formed therein; and a second well of the first conductivity type formed in the semiconductor substrate and having formed therein a sub-word line driver configured to drive a word line of the memory cell, wherein the first well is biased to a first voltage selected based on a junction leakage current and a transistor leakage current associated with the memory cell, and the second well is biased to a second voltage selected based on margins of AC timing parameters and standby characteristics of NMOS transistors associated with the sub-word line driver such that the first voltage and the second voltage are different voltages.

13. The device of claim 12, wherein the first voltage is lower than the second voltage.

14. The device of claim 12, wherein the first and second wells have different doping concentrations.

15. The device of claim 12, further comprising:
a third well of a second conductivity type formed between the first and second wells in the semiconductor substrate, the third well configured to isolate the first well from the second well.

16. A semiconductor memory device comprising:
a memory cell formed in a first p-type well of a substrate, the memory cell having a first n-type metal oxide semiconductor (NMOS) transistor, the first NMOS transistor configured to receive a first back bias voltage to adjust a threshold voltage of the first NMOS transistor, the first back bias voltage selected based on a junction leakage current and a transistor leakage current of the first NMOS transistor associated with the memory cell; and at least one of a line driver and a sense amplifier formed in second p-type wells of the substrate, the line driver and the sense amplifier each including a second NMOS transistor, the line driver configured to drive a word line of the memory cell to output data and the sense amplifier configured to sense and amplify the data output from the memory cell, the second NMOS transistor configured to receive a second back bias voltage to adjust the threshold voltage of the second NMOS transistor, the second back bias voltage being selected based on margins of AC timing parameters and standby characteristics of the second NMOS transistor associated with the sense amplifier such that the second back bias voltage is a different voltage from the first back bias voltage.

17. The semiconductor memory device of claim 16, wherein the threshold voltage of the first NMOS transistor and the second NMOS transistor decrease by different amounts, if the first back bias voltage and the second back bias voltage are respectively applied thereto.

18. The semiconductor memory device of claim 16, further comprising:
guard rings formed in n-type wells between the memory cell and the at least one of the line driver and the sense amplifier, the guard rings configured to isolate the memory cell from the at least one of the line driver and the sense amplifier.

19. The semiconductor memory device of claim 16, further comprising:
a precharge circuit formed in a third p-type well on a first side of the sense amplifier, the precharge circuit configured to precharge bit lines of the memory cell; and
a column select circuit formed in a fourth p-type well on a second side of the sense amplifier, the column select circuit configured to connect the bit lines to input/output (I/O) lines, wherein
the precharge circuit and the column select circuit each include a third NMOS transistor configured to receive the second back bias voltage to adjust the threshold voltage of the third NMOS transistor.

20. The semiconductor memory device of claim 16, wherein the first back bias voltage is less than the second back bias voltage.

* * * * *